(12) United States Patent
Khanarian

(10) Patent No.: US 7,955,531 B1
(45) Date of Patent: *Jun. 7, 2011

(54) PATTERNED LIGHT EXTRACTION SHEET AND METHOD OF MAKING SAME

(75) Inventor: Garo Khanarian, Princeton, NJ (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 946 days.

This patent is subject to a terminal disclaimer.

(21) Appl. No.: 11/724,387

(22) Filed: Mar. 15, 2007

Related U.S. Application Data

(60) Provisional application No. 60/795,219, filed on Apr. 26, 2006.

(51) Int. Cl.
*B29D 11/00* (2006.01)
*H01L 33/00* (2010.01)

(52) U.S. Cl. .......... 264/1.7; 156/60; 257/100; 264/1.21; 264/2.7; 359/599

(58) Field of Classification Search .............. 264/1.1, 264/1.21, 1.7, 1.9, 2.7; 257/79, 98, 100; 359/599; 362/606, 611, 613, 800; 156/60
See application file for complete search history.

(56) References Cited

U.S. PATENT DOCUMENTS

| | | | |
|---|---|---|---|
| 4,731,155 A | 3/1988 | Napoli et al. | |
| 5,772,905 A | 6/1998 | Chou | |
| 6,271,273 B1 | 8/2001 | You et al. | |
| 6,657,236 B1 | 12/2003 | Thibeault et al. | |
| 6,831,302 B2 | 12/2004 | Erchak et al. | |
| 6,967,222 B2 | 11/2005 | Khanarian et al. | |
| 6,987,613 B2 | 1/2006 | Pocius et al. | |
| 7,053,419 B1 | 5/2006 | Camras et al. | |
| 7,521,727 B2 * | 4/2009 | Khanarian et al. | 257/98 |
| 2002/0044356 A1 | 4/2002 | Arakawa et al. | |
| 2003/0071366 A1 | 4/2003 | Rubinsztajn et al. | |
| 2003/0117682 A1 | 6/2003 | Clikeman et al. | |
| 2004/0042101 A1 | 3/2004 | Wang et al. | |
| 2004/0116033 A1 | 6/2004 | Ouderkirk et al. | |
| 2005/0018431 A1 | 1/2005 | Shiang | |
| 2005/0056831 A1 | 3/2005 | Senda et al. | |
| 2005/0093008 A1 | 5/2005 | Suehiro et al. | |
| 2005/0110032 A1 | 5/2005 | Saito et al. | |
| 2005/0127378 A1 | 6/2005 | Suehiro et al. | |
| 2005/0139842 A1 | 6/2005 | Murofushi et al. | |
| 2005/0141240 A1 | 6/2005 | Hata et al. | |

(Continued)

FOREIGN PATENT DOCUMENTS

EP  1 577 958 A1  9/2005

(Continued)

OTHER PUBLICATIONS

European Search Report of corresponding European Patent Application No. EP 07 25 1730 mailed Oct. 10, 2007.

(Continued)

*Primary Examiner* — Mathieu D. Vargot
(74) *Attorney, Agent, or Firm* — Jonathan D. Baskin

(57) ABSTRACT

A light extraction encapsulant sheet having a patterned encapsulant region is disclosed. A method of making that light extraction encapsulant sheet and of affixing that light extraction encapsulant sheet to a luminous stack surface of a multi-layer stack is also disclosed.

10 Claims, 13 Drawing Sheets

U.S. PATENT DOCUMENTS

| | | |
|---|---|---|
| 2005/0148105 A1 | 7/2005 | Suehiro et al. |
| 2005/0253130 A1 | 11/2005 | Tsutsumi et al. |
| 2005/0265029 A1 | 12/2005 | Epstein et al. |
| 2006/0056474 A1 | 3/2006 | Fujimoto et al. |
| 2006/0076565 A1 | 4/2006 | Murofushi et al. |
| 2008/0296573 A1 | 12/2008 | Suehiro et al. |

FOREIGN PATENT DOCUMENTS

| | | |
|---|---|---|
| EP | 1 632 956 A1 | 9/2005 |
| GB | 2 400 235 A | 10/2004 |
| WO | WO 01/57559 A1 | 8/2001 |
| WO | WO 2004/044995 A1 | 5/2004 |
| WO | WO 2005/008791 A2 | 1/2005 |
| WO | WO 2005/022654 A2 | 3/2005 |
| WO | WO 2005/029599 A2 | 3/2005 |

OTHER PUBLICATIONS

Hong H.G., et al. Applied Physics Letters, 88, 103505 (2006).
NanoOpto Corporation White Paper #2003-001.
Mural, A., Applied Physics Letters 89, 171111 (2006).

* cited by examiner

PATTERNED LIGHT EXTRACTION SHEET AND METHOD OF MAKING SAME

This application claims the benefit of priority under 35 U.S.C. §119(e) of U.S. Provisional Patent Application No. 60/795,219 filed on Apr. 26, 2006.

The present invention relates a patterned light extraction sheet, to a method of making the patterned light extraction sheet, and to a method of applying that sheet to a multi-layer stack to form a light emitting device having improved light extraction efficiency.

Light emitting devices, for example light emitting diodes (LEDs), generate light using one or more materials having refractive indices (typically n~2.5) much higher than that of air (n=1.0). Typically, light is generated in a multi-layer stack, at least one exterior surface, a luminous stack surface, is intended to release light generated within the multi-layer stack. This luminous stack surface may be in contact with, for example, an encapsulant material. Such encapsulant materials typically have refractive indices in the range n=1.4 to 1.8. The drop in refractive index encountered by light impinging upon the interface between a luminous stack surface and the encapsulant layer is, therefore, substantial, with the result that much of the light generated within the multi-layer stack is reflected back into the multi-layer stack by that interface. That is, instead of exiting the multi-layer stack with concomitant entry into the encapsulant layer, a large fraction of the light is channeled back into the interior of multi-layer stack where a similar large fraction is absorbed, thereby drastically reducing the external quantum yield of light useful for illumination.

U.S. Pat. No. 6,831,302 discloses patterning of an exterior surface of an n-doped GaN layer which is an exterior layer of the multi-layer stack. Portions of that n-doped layer are removed to create openings which are then covered over, but not filled, with encapsulant material, creating a smooth layer of encapsulant surface against the openings to the depressions in the surface of the n-doped GaN layer. This patterning within the outermost semiconductor layer creates a plurality of disruptive high and low refractive index regions normal to the encapsulant surface. These disruptive regions interrupt the low angle reflection of light at the interface as well as the tendency of light reflected at low angle to be guided back and forth, parallel to and near the luminous stack surface, within the n-doped semiconductor layer, until that trapped light is absorbed without ever exiting the multi-layer stack.

While the formation of depressions in the exterior surface of the multi-layer stack may improve quantum yield for semiconductor based light emitting devices, the patterning process can be time consuming, requiring, for example, etching of epitaxial surfaces which typically requires expensive equipment. The patterning process may also disrupt the electronic structure of the light emitting layer which in turn may decrease light emitting efficiency.

There particularly remains a need for a patterned encapsulant sheet that can be fabricated and patterned prior to bonding to the light emitting surface of an LED.

We have discovered that a patterned light extraction sheet can be made having a patterned encapsulant region, wherein that sheet can be made separately and subsequently applied to a multi-layer stack to form a light emitting device having improved light extraction efficiency.

One aspect of the present invention is directed to a method of preparing a light extraction encapsulant sheet, comprising the steps of:
A) providing an encapsulant block comprising encapsulant material; and
B) forming a patterned encapsulant region having an exterior patterned encapsulant surface on a surface of said encapsulant block;
wherein said step of forming said patterned encapsulant region comprises:
a) forming a first recess set comprising at least one first recess;
b) filling said first recess with a first recess filler;
c) optionally, forming a second recess set comprising at least one second recess; and
filling said second recess with a second recess filler;
wherein at least one of said first recess set and said second recess set has a pattern wherein:
said pattern is selected from random pattern, periodic pattern, or a combination thereof,
said pattern has a feature size, in at least one lateral dimension, of at least 5 nanometers and no more than 5,000 microns;
said periodic pattern has a period, in at least one lateral dimension, of at least 10 nanometers and no more than 5,000 microns;
said first recess has a maximum recess depth of at least 25 nanometers and no more than 10,000 microns;
said second recess has a maximum recess depth of at least 25 nanometers and no more than 10,000 microns;
at least one of said first recess and said second recess has a recess opening coincident with said exterior patterned encapsulant surface; and
said first recess filler differs in refractive index from at least one of second recess filler and said encapsulant material by at least 0.001 and no more than 3.0.

A second aspect of the present invention is directed to a light extraction encapsulant sheet suitable for encapsulating a light emitting device comprising:
a proximal patterned encapsulant region having an proximal patterned encapsulant surface, said region comprising:
a first recess set comprising at least one first recess comprising a first recess filler;
optionally, a second recess set comprising at least one second recess comprising a second recess filler; and
a proximal patterned encapsulant surface exterior to said encapsulant sheet;
wherein at least one of said first recess set and said second recess set has a pattern wherein:
said pattern is selected from random pattern, periodic pattern, or a combination thereof,
said pattern has a feature size, in at least one lateral dimension, of at least 5 nanometers and no more than 5,000 microns;
said periodic pattern has a period, in at least one lateral dimension, of at least 10 nanometers and no more than 5,000 microns;
said first recess has a maximum recess depth of at least 25 nanometers and no more than 10,000 microns;
said second recess has a maximum recess depth of at least 25 nanometers and no more than 10,000 microns;
at least one of said first recess and said second recess has a recess opening coincident with said exterior patterned encapsulant surface; and
said first recess filler differs in refractive index from at least one of second recess filler and said encapsulant material by at least 0.001 and no more than 3.0.

BRIEF DESCRIPTION OF THE DRAWINGS

FIG. 8 views 8a-8d each represent a side view of proximal patterned encapsulant region 117. In FIGS. 8b and 8c, second recesses 112-2 have the same shape and size. FIG. 8a further indicates first recess depth 129-1 and maximum first recess depth 130-1 for a given first recess 112-1. FIGS. 8c and 8d show second recess wall 111-2 and second recess opening 119-2, and FIG. 8d indicates second recess depth 129-2 and maximum second recess depth 130-2 for a given second recess 112-2.

FIG. 10 views 10a-10e represent a recess patterns, indicating lateral feature sizes and periods with which pattern features repeat in lateral dimensions x and y.

DETAILED DESCRIPTION

TABLE 1

Figure 1A:
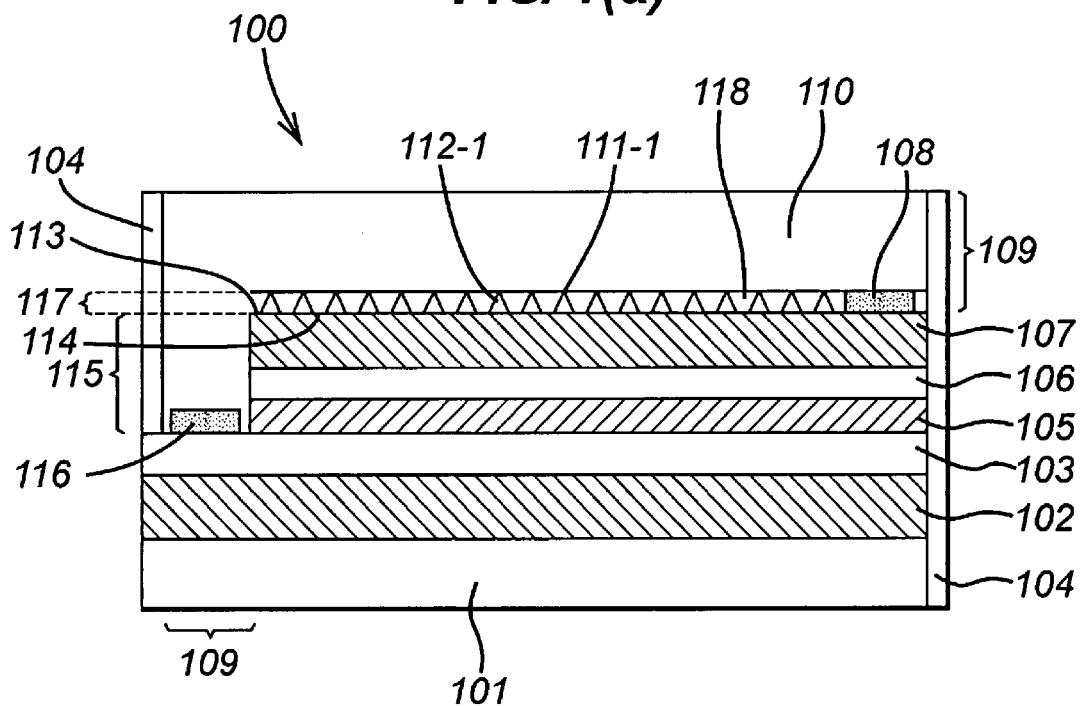
FIG. 1 side views 1a-1b each represent an light emitting device including encapsulant layer 109 having proximal patterned encapsulant region 117.

Index to components identified numerically in the Drawings.

| Numerical Identifier | Description |
| --- | --- |
| 100 | light emitting diode (LED) |
| 101 | submount |
| 102 | bonding layer |
| 103 | reflective layer |
| 104 | support |
| 105 | p-doped layer |
| 106 | light generating layer |
| 107 | n-doped layer |
| 108 | n-side contact pad |
| 109 | encapsulant layer |
| 110 | unpatterned encapsulant region |
| 111-1 | first recess wall |
| 111-2 | second recess wall |
| 112-1 | first recess |
| 112-2 | second recess |
| 113 | proximal patterned encapsulant surface |
| 114 | luminous stack surface |
| 115 | multi-layer stack |
| 116 | p-side contact layer |
| 117 | proximal patterned encapsulant region |
| 118 | inter-recess volume element |
| 119-1 | first recess opening |
| 119-2 | second recess opening |
| 120 | encapsulant block |
| 121 | encapsulant block unpatterned proximal surface |
| 122 | patterned mold |
| 123 | mold patterned surface |
| 124 | mold protrusions |
| 125 | first recess filler layer |
| 126 | first recess filler surface excess |
| 127 | cover slip |
| 128 | proximal patterned encapsulant region thickness |
| 129-1 | first recess depth |
| 129-2 | second recess depth |
| 130-1 | maximum first recess depth |
| 130-2 | maximum second recess depth |
| 131 | auxiliary light transmitting layer |
| 132 | x-dimension feature size |
| 133 | x-dimension period |
| 134 | y-dimension feature size |
| 135 | y-dimension period |

Figure 1B:
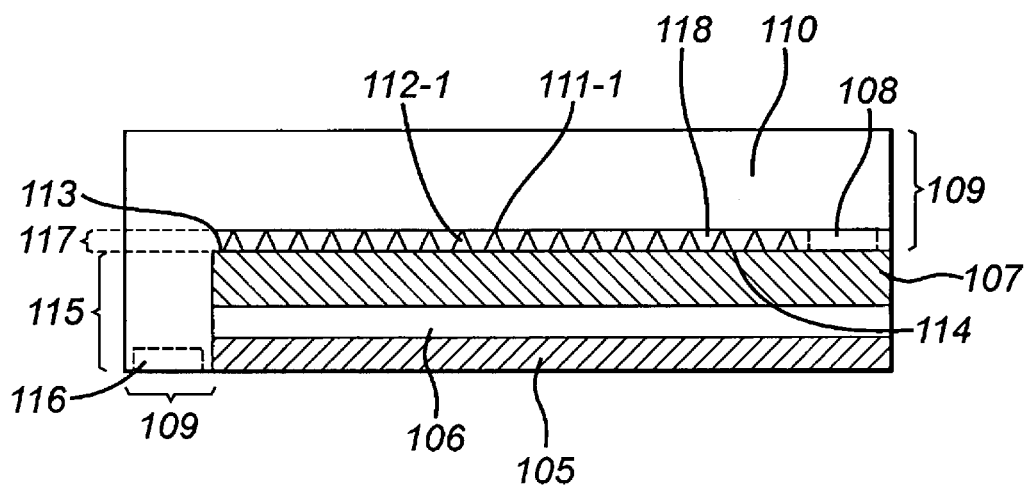
Figure 2A:
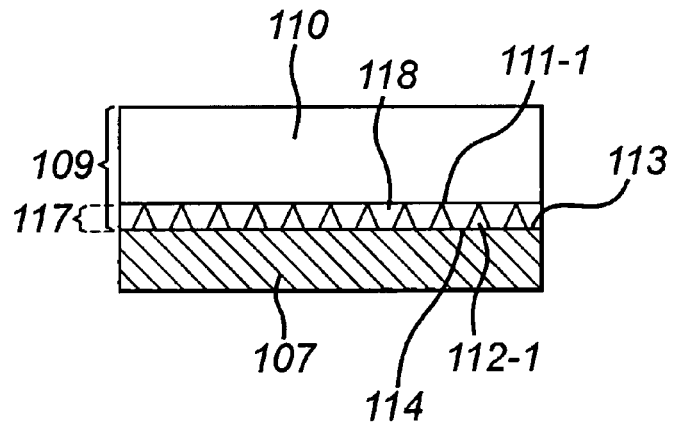
FIG. 2 LED side views 2a-2f each represent a portion of an light emitting device including n-doped layer 107 and encapsulant layer 109 having a proximal patterned encapsulant region 117.
Figure 2B:
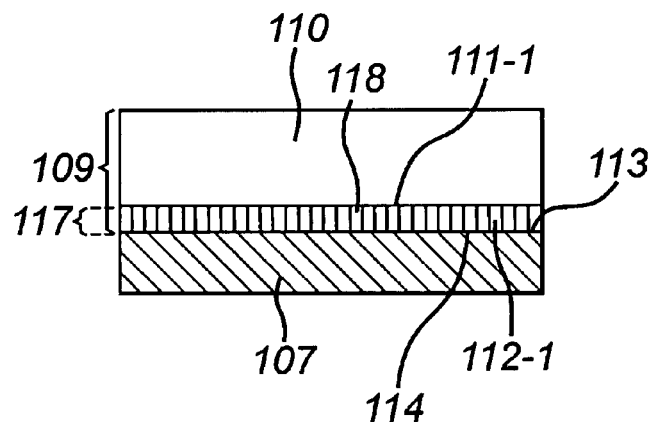
Figure 2C:
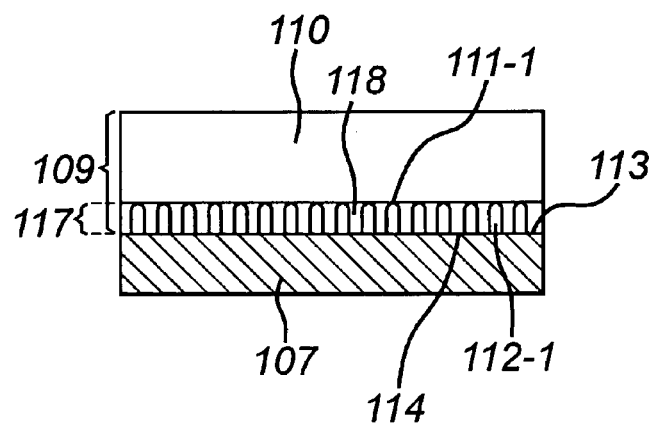
Figure 2D:
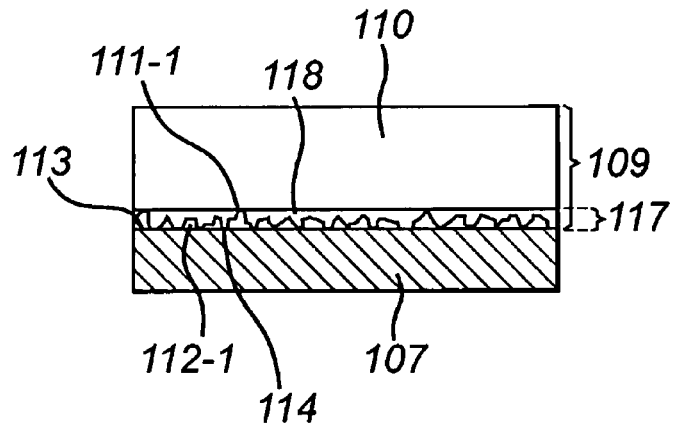
Figure 2E:
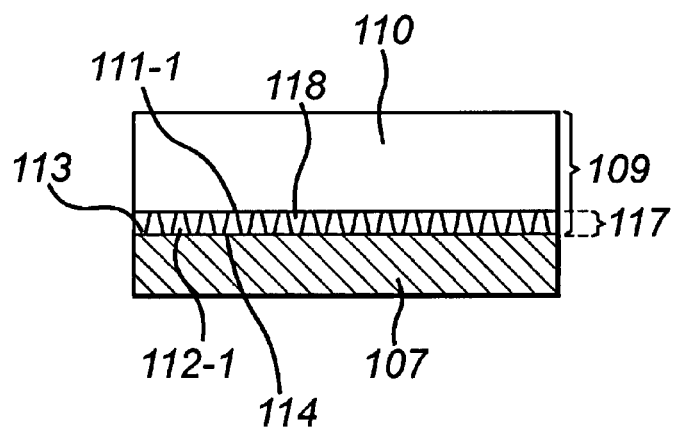
Figure 2F:
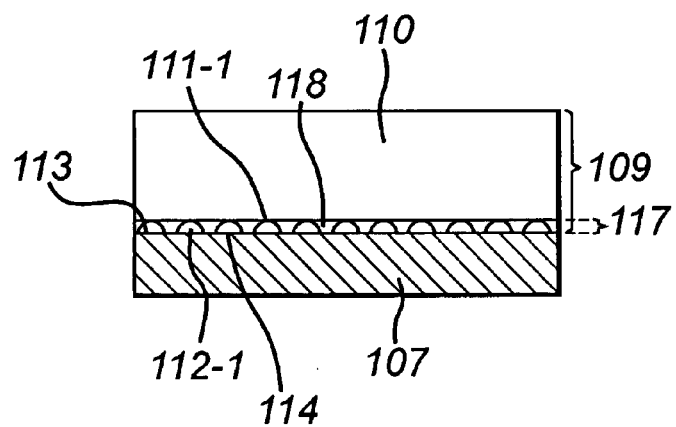

FIG. 1 side views 1a-1b represent side views of an example of a light emitting device 100 in the form of a packaged die. FIG. 1a represents a full packaged die. FIG. 1b represents a portion of that packaged die, emphasizing the disposition of encapsulant layer 109. Light emitting device 100 includes a multi-layer stack 115. Multi-layer stack 115 includes: p-doped layer 105, light generating layer 106, and n-doped layer 107. P-doped layer 105 of multi-layer stack 115 is disposed upon reflective layer 103 which, in turn is disposed upon bonding layer 102 which, in turn, is disposed upon submount 101. N-side contact pad 108 provides electrical contact to n-doped layer 107. P-side contact pad 116 provides electrical contact to p-doped layer 105. Encapsulant layer 109, including unpatterned encapsulant region 110 is disposed upon multi-layer stack 115 at luminous stack surface 114 which is, in this case, an exterior surface of n-doped layer surface. Encapsulant layer 109 further extends to p-side contact pad 116 at reflective layer 103. Proximal patterned encapsulant region 117, including its patterned encapsulant surface 113, is patterned by first recesses 112-1 which are bounded by first recess walls 111-1. Here, light emitting device 100 further includes support 104.

FIG. 2 side views 2a-2f each represent a portion of an light emitting device 100 including n-doped layer 107, luminous stack surface 114 (which is, in this case, an exterior surface of n-doped layer surface), proximal patterned encapsulant surface 113, first recesses 112-1, first recess walls 111-1, unpatterned encapsulant region 110 and encapsulant layer 109. Views 2a, 2b, 2c, 2e, and 2f include cross-sectional views of periodic arrays of first recesses 112-1 having, respectively, cone, right cylindrical, right cylindrical with curved base, truncated cone, and hemispherical shapes. View 2d represents a random arrangement of randomly shaped first recesses 112-1.

Figure 3A:
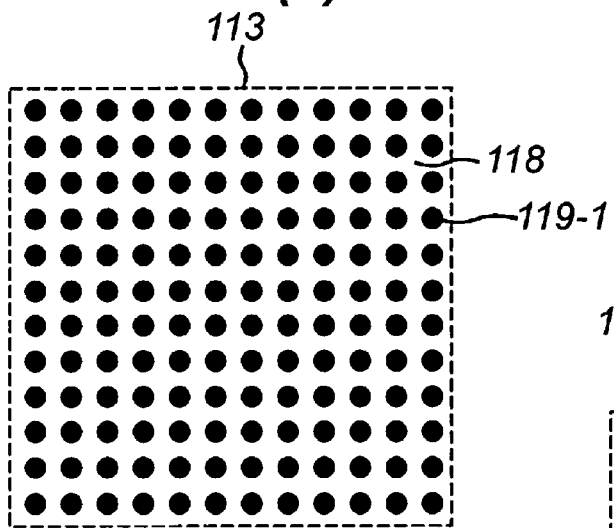
FIG. 3 light emitting device views 3a-3d each represent proximal patterned encapsulant surface 113, including first recess openings 119-1 and inter-recess volume element 118.
Figure 3B:
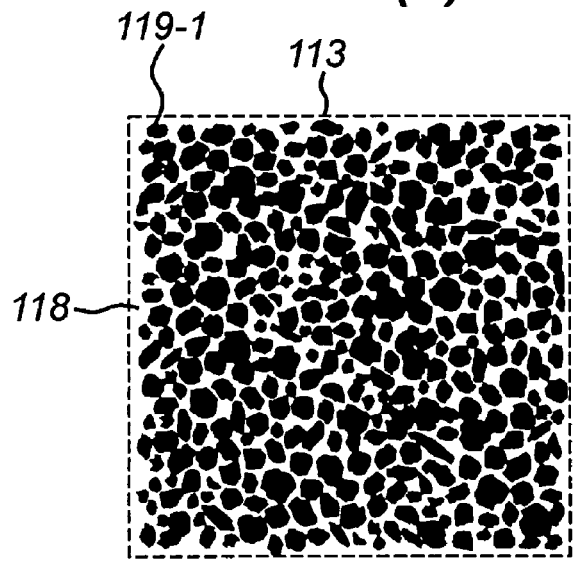
Figure 3C:
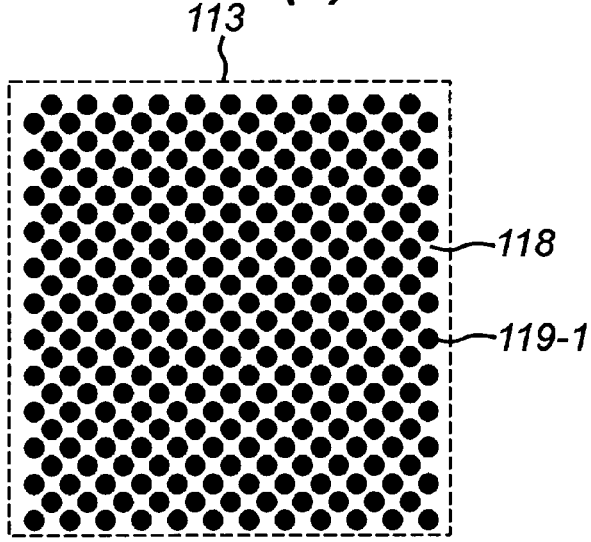
Figure 3D:
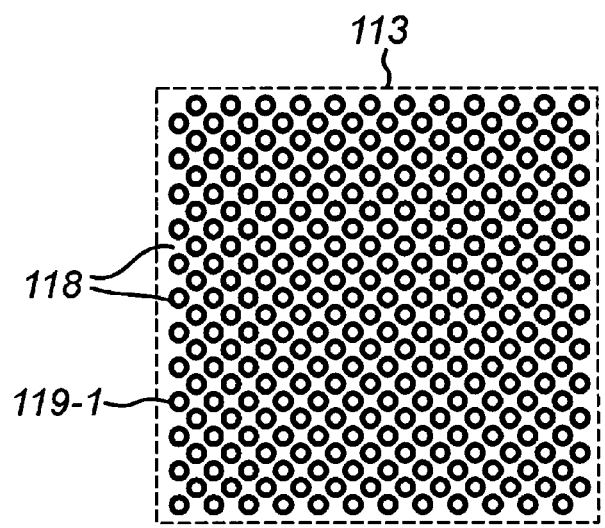
Figure 4A:
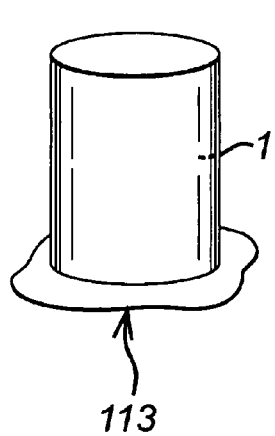
FIG. 4 views 4a, 4c, 4e, and 4h each represent a first recess 112-1 having a first recess opening 119-1 at proximal patterned encapsulant surface 113 and inter-recess volume element 118. Views 4b, 4d, 4f, and 4g each represent a first recess opening 119-1 at proximal patterned encapsulant surface 113.
Figure 4B:
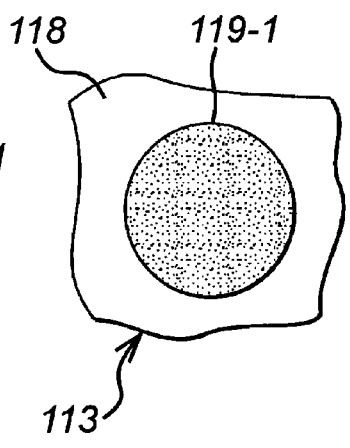

FIG. 3 views 3a-3d each represent a proximal patterned encapsulant surface 113 of encapsulant layer 109, having first recess openings 119-1 included in proximal patterned encapsulant surface 113. FIG. 3a represents a square array of circular first recess openings 119-1. The shape of an individual first recess 112-1 having a first recess opening of FIG. 3a is depicted in FIGS. 4a and 4b. FIG. 3b represents a random distribution of randomly shaped first recess openings 119-1. FIG. 3c represents a diagonal array of circular first recess openings 119-1. The shape of an individual first recess having a first recess opening of FIG. 3c is depicted in FIGS. 4a and 4b. FIG. 3d represents a diagonal array of first recess openings 119-1 having a circular shell shape. The shape of an individual first recess having a first recess opening 119-1 of FIG. 3d is depicted in FIGS. 4c and 4d.

Figure 4C:
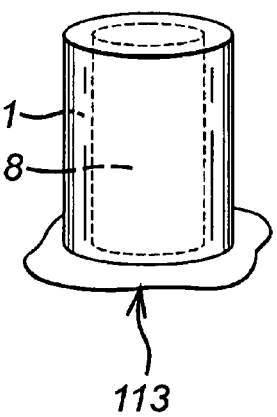
Figure 4D:
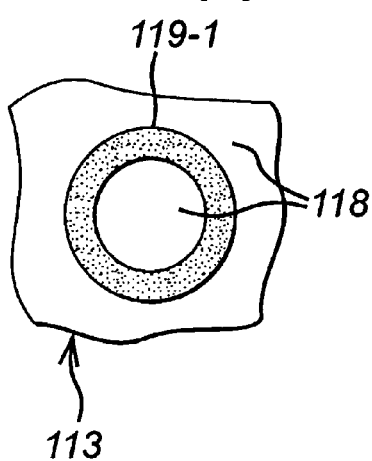
Figure 4E:
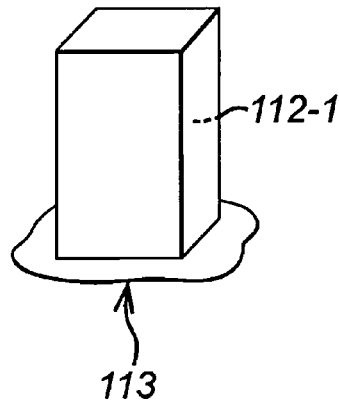
Figure 4F:
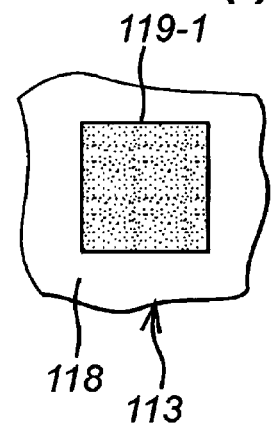
Figure 4G:
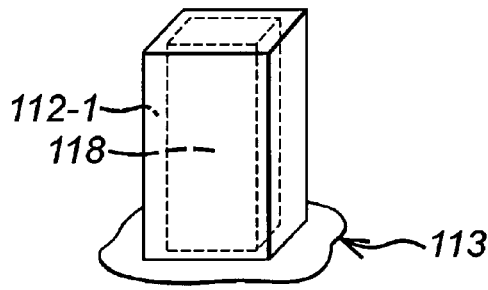
Figure 4H:
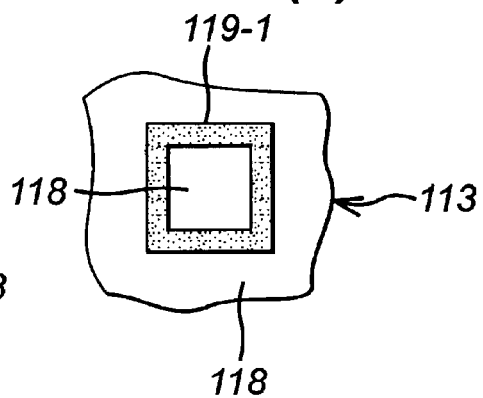
Figure 5A:
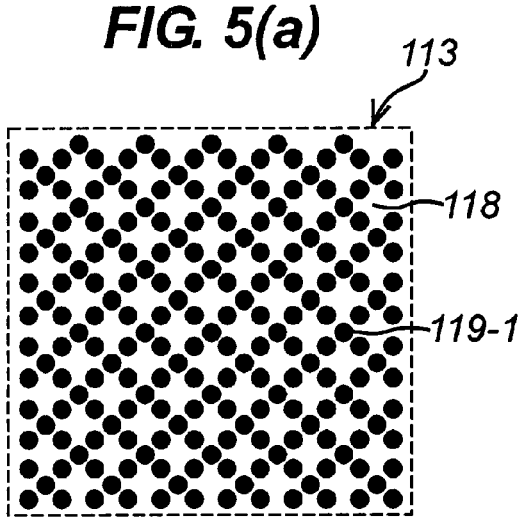
FIG. 5 light emitting device views 5a-5e each represent a proximal patterned encapsulant surface 113, including first recess openings 119-1 and inter-recess volume element 118.
Figure 5B:
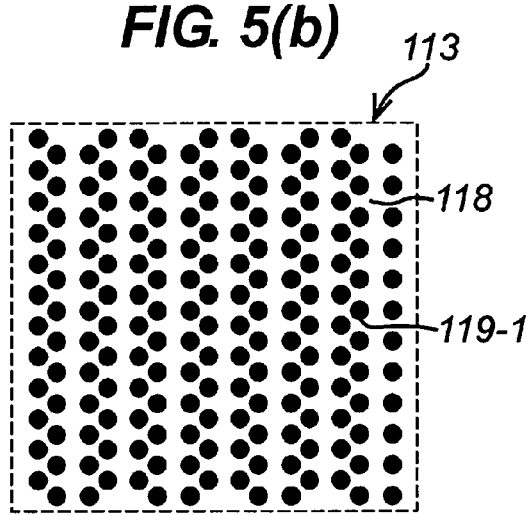
Figure 5C:
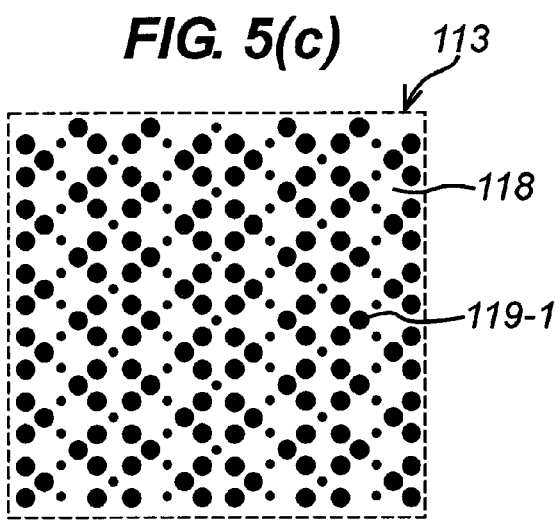
Figure 5D:
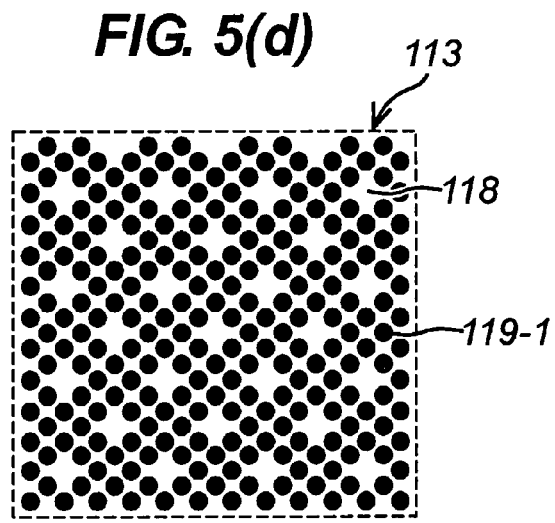
Figure 5E:
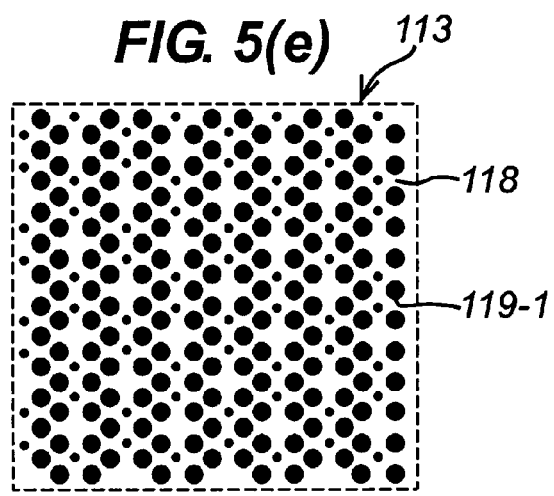

FIGS. 4a, 4c, 4e, and 4g are side views of individual first recesses 112-1 viewed from the same side view perspective as FIGS. 1 and 2. FIGS. 4b, 4d, 4f, and 4h are views of the proximal patterned encapsulant surface 113 of proximal patterned encapsulant region 117 which includes first recess openings 119-1. FIG. 4a represents a right cylindrical first recess 112-1, and FIG. 4b represents the first recess opening 119-1 of that regular cylindrical first recess 112-1. FIG. 4c represents a right cylindrical shell first recess 112-1, wherein that recess is bounded both outside and inside by inter-recess volume element 118, and FIG. 4d represents a first recess opening 119-1 of that right cylindrical shell. FIG. 4e represents a right parallelepiped first recess 112-1, and FIG. 4f represents the rectangular first recess opening 119-1 of that right parallelepiped first recess 112-1. FIG. 4g represents a first recess 112-1 which is a right parallelepiped shell, wherein that first recess is bounded both outside and inside by inter-recess volume element 118, and FIG. 4h represents a first recess opening 119-1 of that right parallelepiped shell 112-1.

FIGS. 5a-5e each represent a proximal patterned encapsulant surface 113, including first recess openings 119-1 and inter-recess volume element 118. All of these are viewed from the same perspective as FIGS. 3a-3d, i.e., facing luminous stack surface 114 (see FIGS. 1 and 2).

Figure 6A:
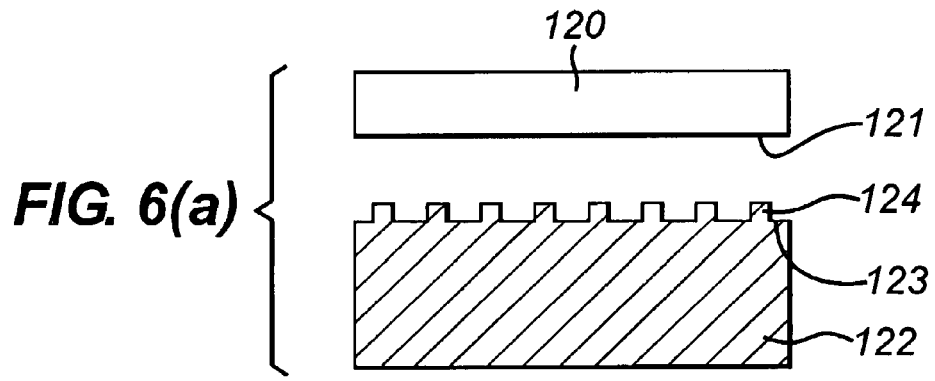
FIG. 6 views 6a-6d each represent a side view of encapsulant block 120 and of a patterned mold which forms first recesses 112-1 in the surface of encapsulant block 120 that is being transformed into proximal patterned encapsulant surface 113 of an encapsulant layer 109.
Figure 6B:
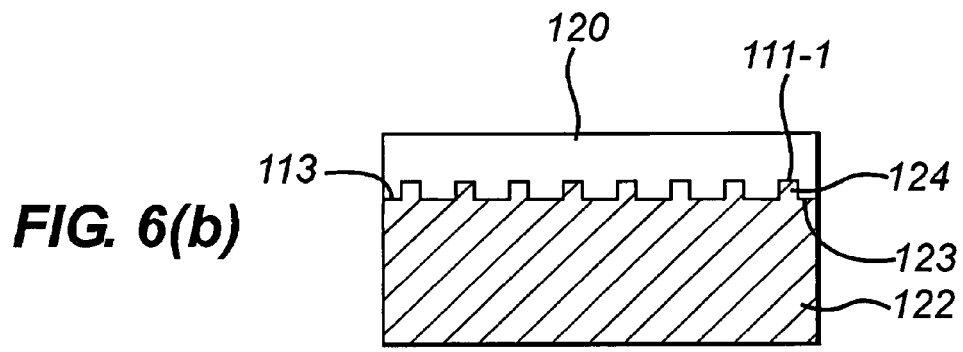
Figure 6C:
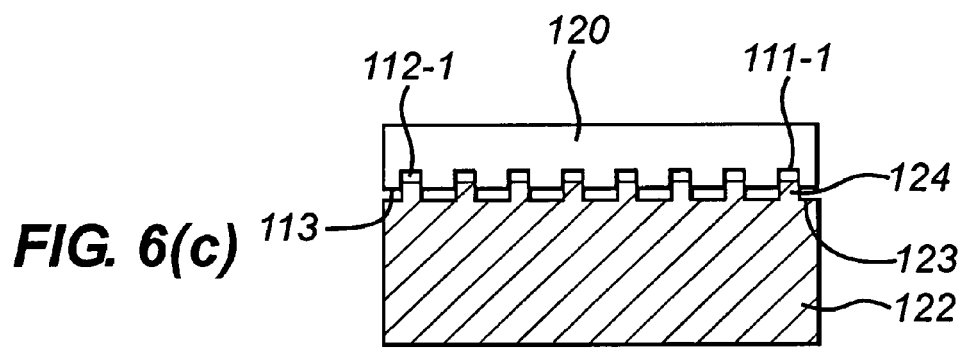
Figure 6D:
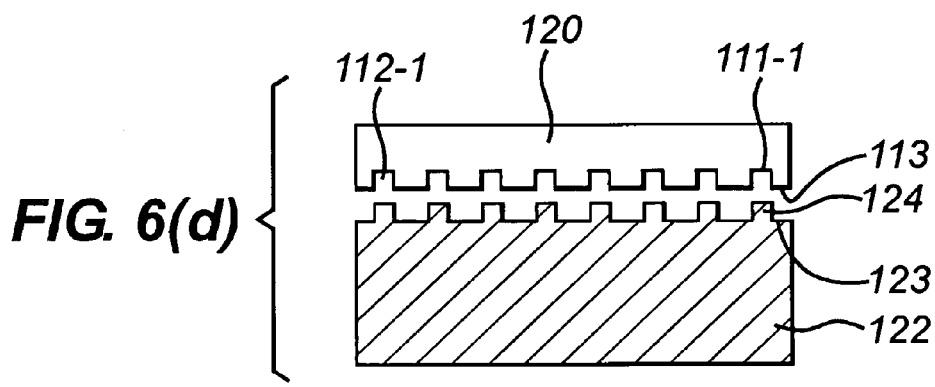

FIGS. 6a-6d each represent a side view of an encapsulant block and of a patterned mold which forms first recesses 112-1 during formation what will become proximal patterned encapsulant region 117. FIG. 6a (top) represents encapsulant block 120 having encapsulant block unpatterned proximal surface 121; and FIG. 6a (bottom) represents patterned mold 122 having mold patterned surface 123 having mold protrusions 124. FIG. 6b represents penetration of mold protrusions 124 into encapsulant block 120, converting the FIG. 6a encapsulant block unpatterned proximal surface 121 into what will become proximal patterned encapsulant region 117, and forming first recess walls 111-1. FIG. 6c represents partial withdrawal of mold protrusions 124 from newly formed first recesses 112-1 having first recess walls 111-1. FIG. 6d represents fully withdrawn patterned mold 122 and encapsulant block 120 including what will become proximal patterned encapsulant region 117.

Figure 7A:
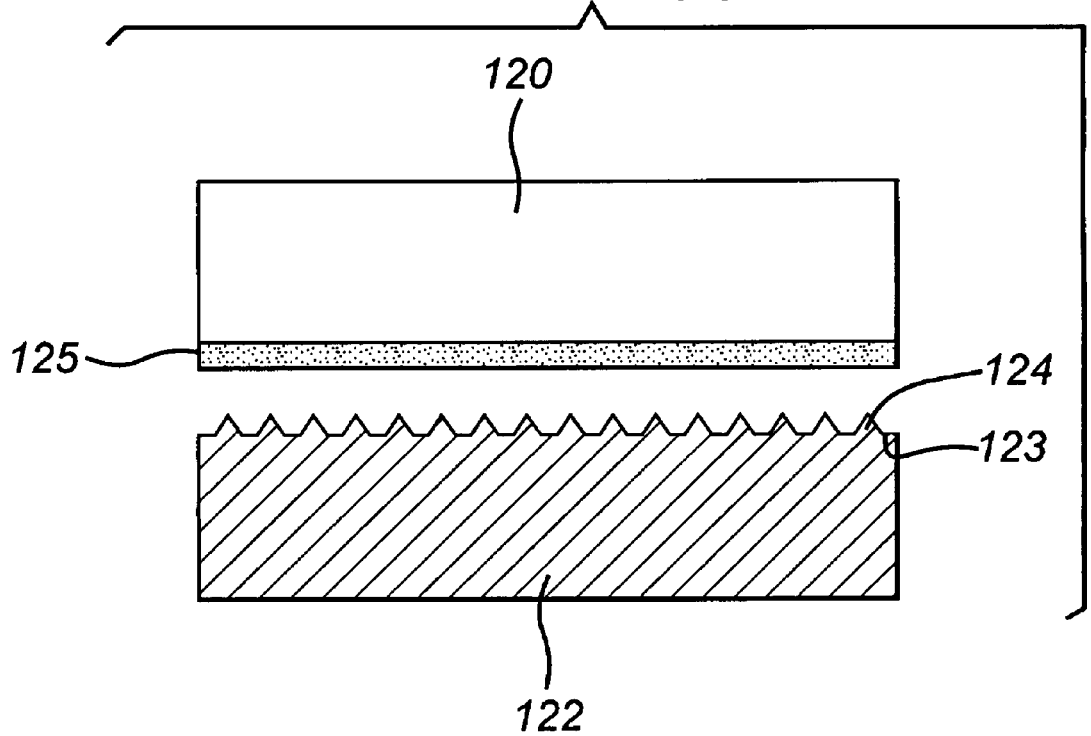
FIG. 7 views 7a-7e each represent a side view during transformation of encapsulant block 120, coated with first recess filler layer 125, into an encapsulant layer 109 having proximal patterned encapsulant region 117 which includes first recesses 112-1 having first recess walls 111-1. First recess 112-1 is filled, completely or partially, with first recess filler derived from first recess filler layer 125. Views 7a-7c each further include a side view of a patterned mold used to form a relief pattern in the encapsulant block 120. View 7d represents proximal patterned encapsulant region 117, the first recess 112-1 of which contains first recess filler derived from first recess filler layer 125 and second recesses 112-2 containing second recess filler.
FIG. 7d represents a case in which first recess filler surface excess 126 has not been removed, or has been partially removed. View 7e represents a proximal patterned encapsulant region 117 formed by removal of first recess filler surface excess 126 during planarization.
Figure 7B:
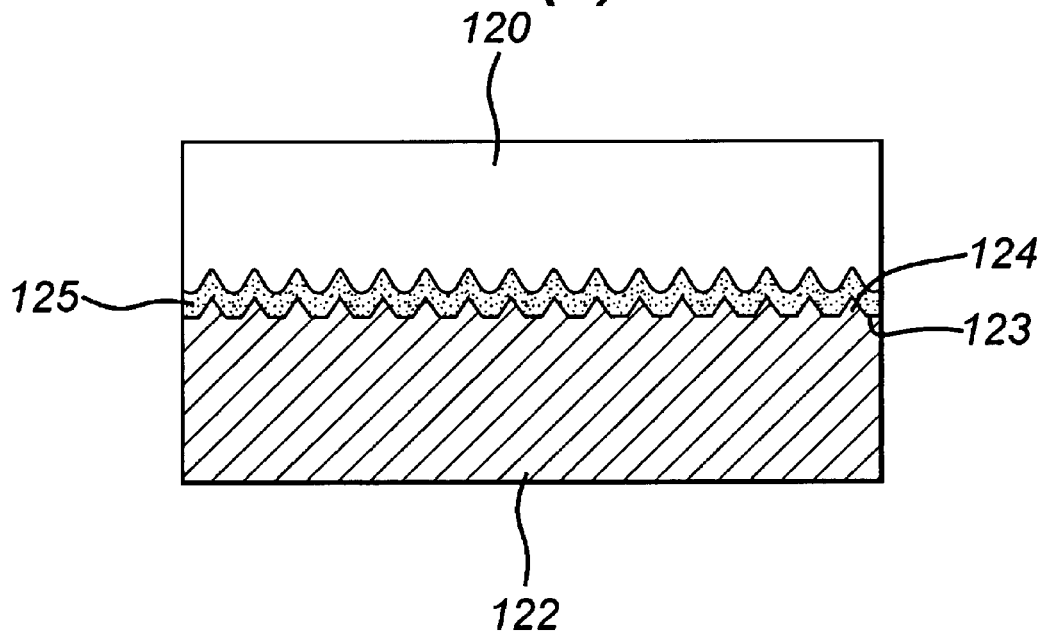
Figure 7C:
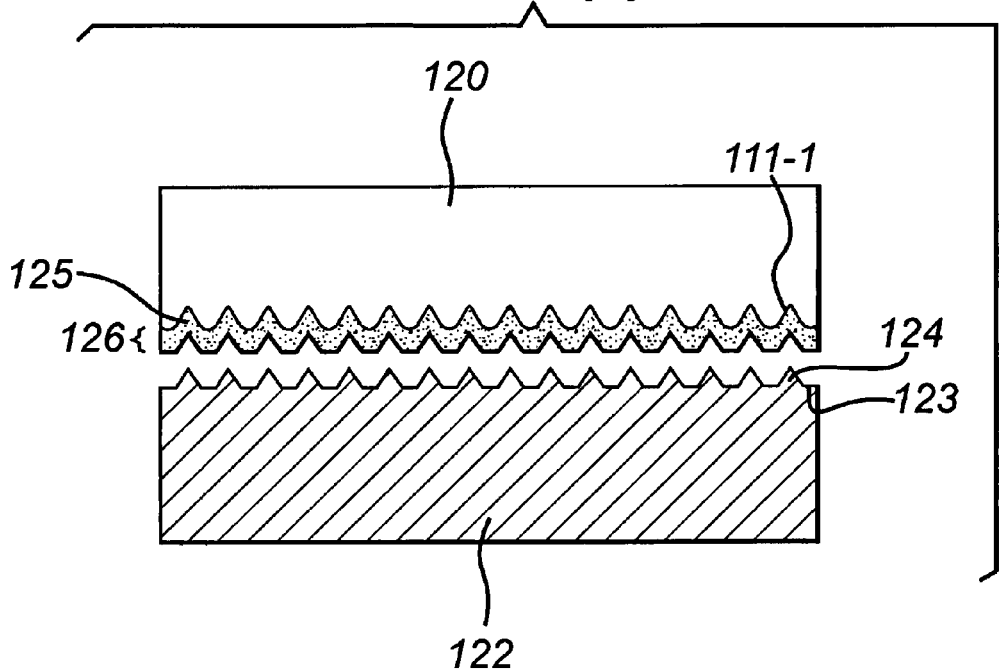
Figure 7D:
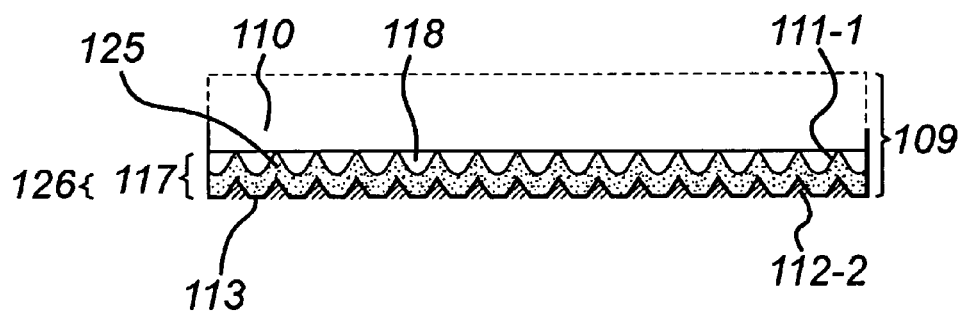
Figure 7E:
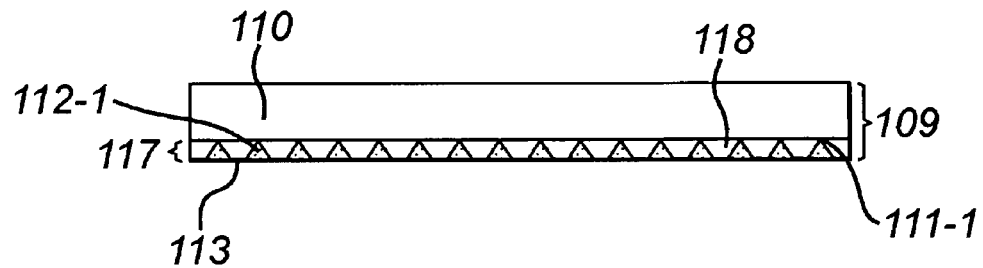
Figure 8A:
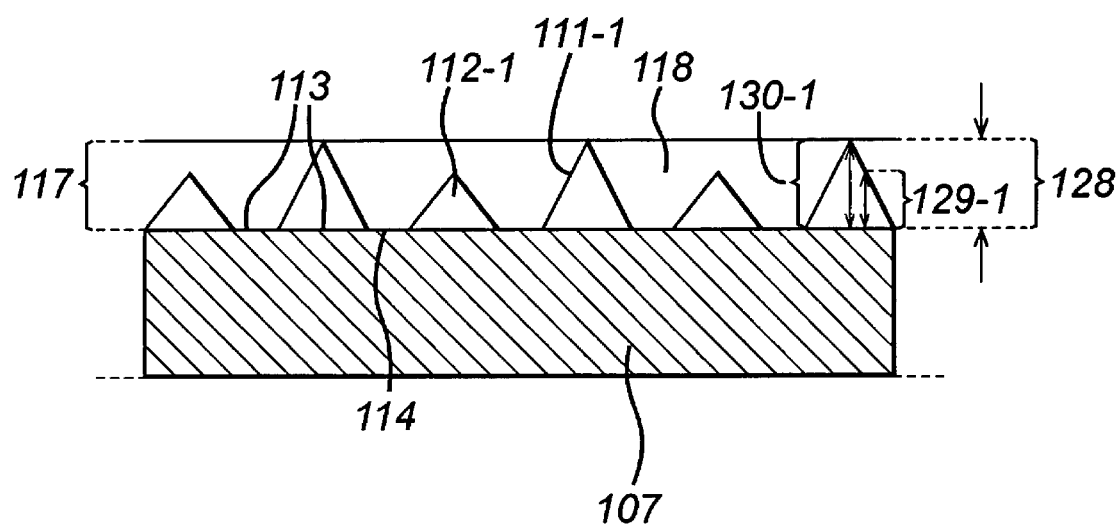
FIG. 8a represents first recesses 112-1 having more than one size, and inter-recess volume element 118.
Figure 8B:
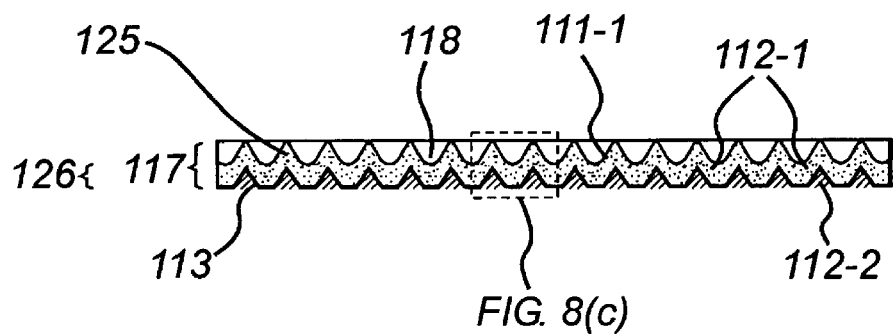
FIGS. 8b and 8c includes first recess 112-1 and second recess 112-2.
Figure 8C:
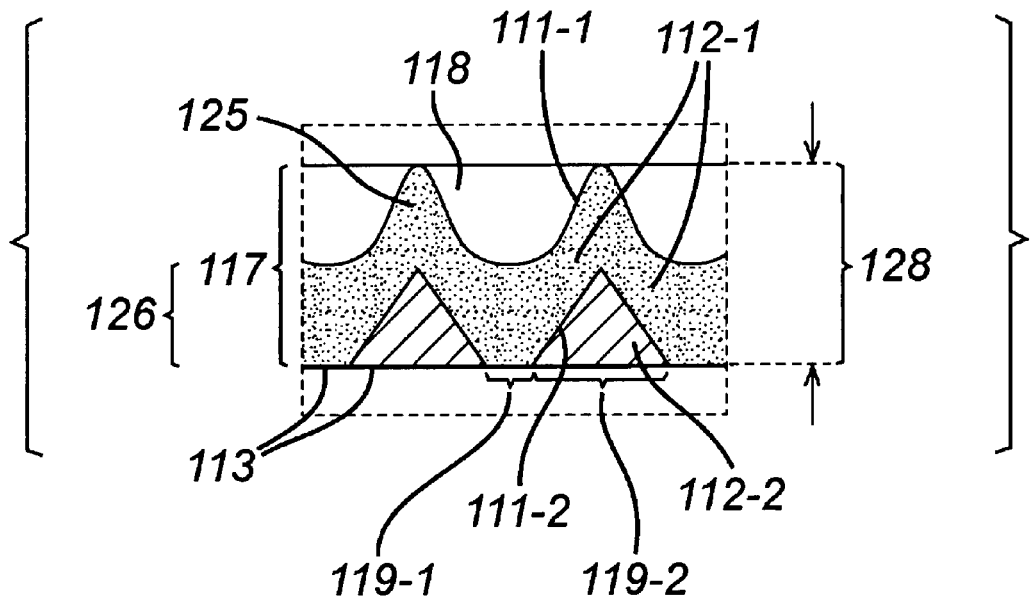
Figure 8D:
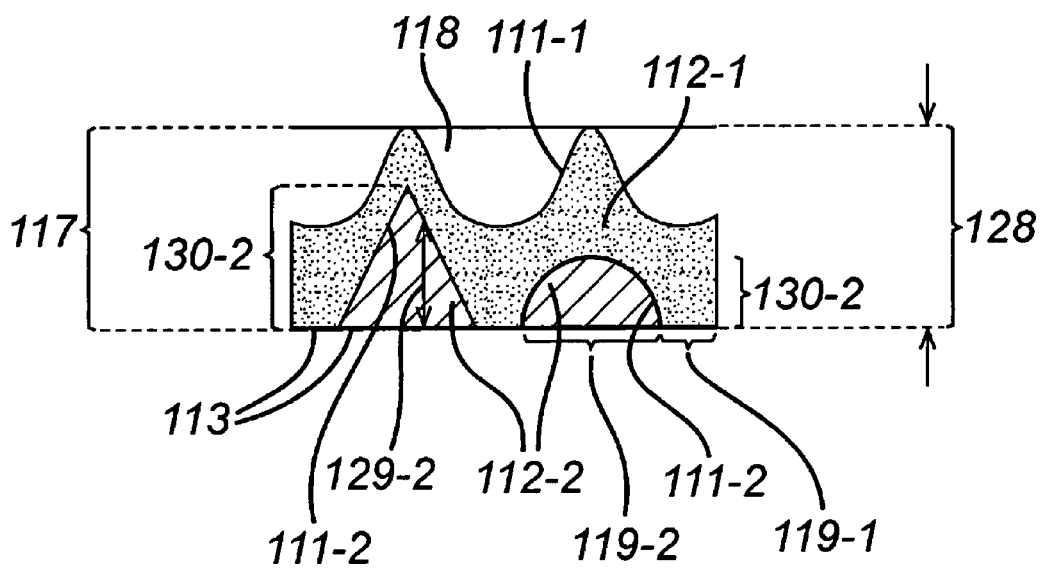
In FIG. 8d, second recesses 112-2 differ in shape and size.

FIGS. 7a-7e each represent a side view during transformation of encapsulant block 120, coated with first recess filler layer 125, into proximal patterned encapsulant layer 109 having proximal patterned encapsulant region 117, itself having proximal patterned encapsulant surface 113, first recess walls 111-1, and first recesses 112-1 filled, partially or completely, with first recess filler derived from first recess filler layer 125. FIGS. 7a-7c further include a side view of patterned mold 122 which forms relief patterns during formation of the proximal patterned encapsulant region 117 of the proximal patterned encapsulation layer 109 prior to incorporation of layer 109 into a light emitting device. FIG. 7a (top) represents encapsulant block 120, coated with first recess filler layer 125. FIG. 7a (bottom) represents patterned mold 122 having mold surface 123 having mold protrusions 124. FIG. 7b represents formation of relief patterned first recess filler layer 125 by action of patterned mold 122 upon first recess filler layer 125 which, in turn, penetrates encapsulant block 120 to form a relief pattern in the encapsulant material of encapsulant block 120. FIG. 7c (top) represents encapsulant block 120 having patterned first recess filler layer 125. First recess filler penetrates encapsulant block 120 while patterning the surface of that block and creating inter-recess volume elements 118 containing encapsulant material (see FIGS. 7d and 7e) and extends leaving first recess filler surface excess 126. FIG. 7c (bottom) represents withdrawn patterned mold 122. FIG. 7d represents encapsulant layer 109 having proximal patterned encapsulant region 117, first recesses 112-1 and second recesses 112-2. First recess filler surface excess is no longer an excess, but has become first recess filler for an extended first recess 112-1. Second recesses 112-2 are filled with a second recess filler to form proximal patterned encapsulant surface 113. FIG. 7e represents encapsulant layer 109, including unpatterned encapsulant region 110 and proximal patterned encapsulant region 117, having first recesses 112-1, and second recesses 112-2. First recesses 112-1 are filled with first recess filler derived from first recess filler layer 125, and excess first recess filler material has been removed by planarization to form proximal patterned encapsulant surface 113. When the term "proximal" is used FIG. 7, or any other figures, and an encapsulant layer 109 is not associated with a multi-layer stack 115, the use of "proximal" indicates a region or surface of that encapsulant layer 109 suitable for being disposed upon a luminous stack surface 114.

FIG. 8 views 8a-8d each represent a side view of proximal patterned encapsulant region 117. FIG. 8a represents proximal patterned encapsulant region 117, having patterned region thickness 128 disposed upon luminous stack surface 114 of n-doped layer 107, and including first recesses 112-1 having more than one size. A first recess depth 129-1 is depicted for a first recess 112-1, as is the maximum first recess depth 130-1 for that first recess 112-1. FIGS. 8b and 8c represent a first recess 112-1 having first recess openings 119-1 and second recesses 112-2 having second recess openings 119-2. FIG. 8c indicates second recesses 112-2, included in proximal patterned encapsulant region 117, having second recess walls 111-2 and second recess openings 119-2 coincident with proximal patterned encapsulant surface 113. In FIGS. 8b and 8c, second recesses 112-2 have the same shape and size. In FIG. 8d, second recesses 112-2 differ in shape and size. For a given second recess 112-2, the second recess depth 129-2 associated with a given point on second recess wall 111-2 may be equal to or less than the maximum second recess depth 130-2 for that second recess 112-2 (see FIG. 8d). The maximum second recess depth 130-2 is indicated for each of FIG. 8d second recesses 112-2.

Figure 9:
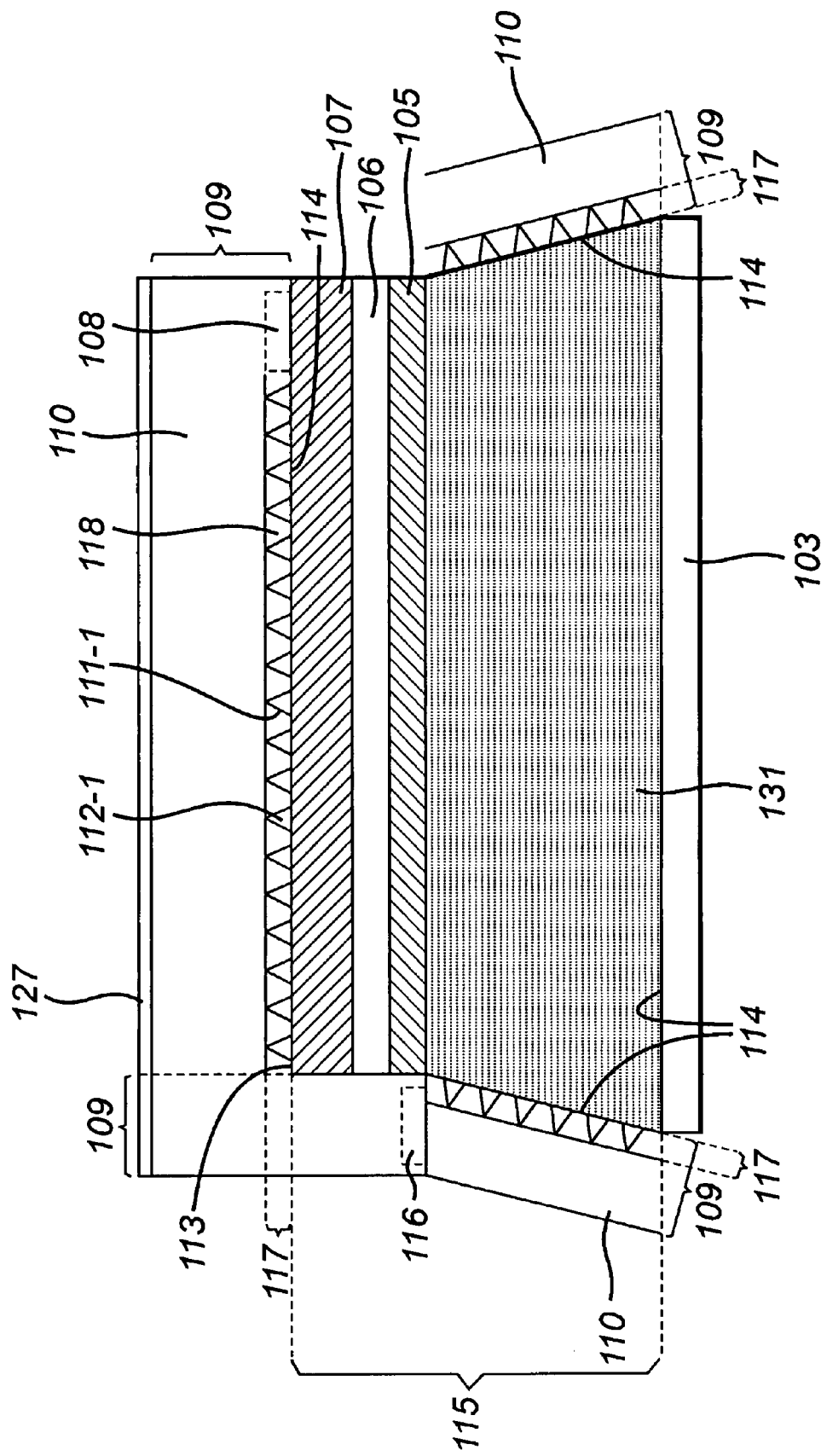
FIG. 9 represents a side view of multi-layer stack 115 as in FIG. 1b, except that multi-layer stack 115 further includes optional auxiliary light transmitting layer 131 and optional cover slip 127. In addition to the luminous stack surface 114 shown in FIG. 1b, two luminous stack surfaces 114 of auxiliary light transmitting layer 131 are shown, each having a proximal patterned encapsulant region 117 disposed upon it. Auxiliary light transmitting layer 131 further has a luminous stack surface 114, opposite p-doped layer 105, which is disposed upon reflective layer 103, and which does not have a proximal patterned encapsulant region 117 disposed thereupon.

FIG. 9 represents a side view of multi-layer stack 115 as in FIG. 1b, except that multi-layer stack 115 further includes optional auxiliary light transmitting layer 131 and cover slip 127. P-doped layer 105 is disposed upon auxiliary light transmitting layer 131, which is disposed upon reflective layer 103. Encapsulant layers 109, having proximal patterned encapsulant regions 117, are disposed upon luminous stack surfaces 114 of auxiliary light transmitting layer 131 along with being disposed upon luminous stack surface 114 of n-doped layer 107.

FIG. 10 views 10a-10e represent recess patterns, indicating lateral feature sizes and periods. FIGS. 10a and 10c-10e are side views of proximal patterned encapsulant region 117. FIG. 10b is a view of proximal patterned encapsulant region 117 from a vantage point above the distal surface of proximal patterned encapsulant region 117. FIGS. 10a and 10b represent the same proximal patterned encapsulant region 117 having the same pattern of first recesses 112-1. In FIG. 10a, x-dimension feature size 132 and x-dimension period 133 are indicated for a pattern of first recesses 111-1. FIG. 10b further indicates y-dimension feature size 134 and y-dimension period 135 for the recess pattern of first recesses 112-1. FIG. 10c represents a first recess 112-1 which is a single recess having no patterning at the distal surface of proximal patterned encapsulant region 117, but having a proximal recess pattern having first recess openings 119-1 at proximal patterned encapsulant surface 113. Second recesses 112-2 form a complementary pattern. X-dimension feature size 132 and x-dimension period 133 are indicated for each pattern. The proximal patterned encapsulant region of FIG. 10d is identical to that of 10c, except that first recess 112-1 is further patterned at the distal surface of proximal patterned excapsulant region 117. In this case, inter-recess volume elements 118 are present, forming a complementary pattern. Each of the two patterns of first recess 112-1 has an x-dimension feature size 132 and an x-dimension period 133. FIG. 10e is identical to FIG. 10d, except that x-dimension feature size 132 and an x-dimension period 133 are indicated for the pattern of second recesses 112-2.

The figures of the drawings are intended to illustrate embodiments of the present invention and to visually provide further clarification of numbered portions of the light emitting device which are defined in the text. These figures are not, in any way, intended to limit the scope of the present invention. One of skill in the art will recognized that there are other specific embodiments of the present invention which differ in detail from those embodiments encompassed by the figures.

The terminology of this specification includes words specifically mentioned herein, derivatives thereof, and words of similar import.

Used herein, the following terms have these definitions:

The words "a" and "an" as used in the specification mean "at least one".

"Range". Disclosures of ranges herein take the form of lower and upper limits. There may be one or more lower limits and, independently, one or more upper limits. A given range is defined by selecting one lower limit and one upper limit. The selected lower and upper limits then define the boundaries of that particular range. All ranges that can be defined in this way are inclusive and combinable, meaning that any lower limit may be combined with any upper limit to delineate a range.

A "submount" 101 is a support substrate upon which a multi-layer stack may be affixed directly, or affixed indirectly through intervening layers.

A "multi-layer stack" 115 is a stack of layers, including p-doped layer 105, light generating layer 106, and n-doped layer 107, within which light is generated. Multi-layer stack 115 may be inorganic, small molecule organic, or polymer/small molecule organic. Herein, the terms "multi-layer stack" and "stack" are used interchangeably. A multi-layer stack 115 may, optionally, include additional layers such as, for example, auxiliary light transmitting layer 131.

A "p-doped layer" 105 includes a p-doped material. The p-doped material may be an organic material, an inorganic material, or an organic-inorganic hybrid material.

An "n-doped layer" 107 includes an n-doped material.

A "p-side contact pad" 116 includes an electrically conducting material, and provides electrical contact to p-doped layer 105.

An "n-side contact pad" 108 includes an electrically conducting material, and provides electrical contact to n-doped layer 107.

A "light generating layer" 106 includes a light generating material, and is disposed between p-doped layer 105 and n-doped layer 107. The light generating layer generates light in response to a voltage difference and current flow between the p-doped layer and the n-doped layer.

A "reflective layer" 103 includes a reflective material that is capable of reflecting at least 50% of light generated by the light generating layer that impinges upon that reflective layer. When a reflective layer is disposed upon a luminous stack surface, the effect is to redirect light generated in multi-layer stack 115, and impinging upon that surface, to another luminous surface 114, one that has been designated for light output.

A "bonding layer" 102 includes a bonding material suitable for bonding adjacent layers (e.g., reflective layer 103 and submount 101) external to multi-layer stack 115. A bonding layer is typically an adhesive material. Where optical clarity is desired, a bonding material having transparency to light over the desired wavelength range is used. An example of an adhesive having transparency to visible light is Optical Adhesive Norland 74.

An "exterior stack surface" of multi-layer stack 115 is a surface that is part of that stack, and beyond which that stack does not extend.

A "luminous stack surface" 114 is an exterior stack surface of multi-layer stack 115 upon which light generated within multi-layer stack 115 impinges. In FIGS. 1 and 2, a surface of n-doped layer 107 is an exterior n-doped layer surface. Therefore, in FIGS. 1 and 2, the exterior n-doped layer surface is a luminous stack surface 114. One skilled in the art will recognize that, although it will often be the case that an exterior n-doped layer surface will be a luminous stack surface 114 of a given light emitting device, a surface of another layer, of multi-layer stack 115, may also have an exterior stack surface which is a luminous stack surface 114. For example, if a surface of p-doped layer 105 is also exterior to multi-layer stack 115 (see FIG. 1), that exterior surface may also be a luminous stack surface 114. It will also be recognized that other configurations of layers within a multi-layer stack are possible. Multi-layer stack 115 may further include an optional "auxiliary light transmitting layer" 131 (see FIG. 9), having an "exterior auxiliary transmitting surface" which is a luminous stack surface 114. A multi-layer stack may have one luminous stack surface 114 or plural luminous stack surfaces 114.

A "distal surface" of an encapsulant layer 109 is a surface of that layer which is most distant from the luminous stack surface 114 upon which that encapsulant layer 109 is disposed. Luminous stack surface 114 is chosen as a convenient spatial reference for indicating the relative positioning of surfaces of encapsulant layer 109. An example of a distal surface of encapsulant layer 109 is the topmost surface of encapsulant layer 109, as depicted in FIG. 1a.

A "proximal surface" of an encapsulant layer 109 is the surface of that layer which is closest to the luminous stack surface 114 upon which that encapsulant layer 109 is disposed. For example (see FIG. 1), the surface of n-doped layer 107 which is an exterior surface of multi-layer stack 115 is a luminous stack surface 114. Patterned surface 113 is disposed upon luminous stack surface 114, and is the surface of encapsulant layer 109 closest to luminous stack surface 114. Therefore, patterned surface 113 is "proximal patterned encapsulant surface 113". The opposing surface of encapsulant layer 109, (i.e., the surface of encapsulant layer 109 which is topmost in FIG. 1a) is then "distal" to luminous stack surface 114, and is the distal surface of the encapsulant layer 109 of FIG. 1a. As indicated in the illustrative example of FIG. 1a, a portion of encapsulant layer 109 extends to p-side contact pad 116 and reflective layer 103 and, as such, includes an additional proximal encapsulant surface at the interface with reflective layer 103.

One skilled in the art will recognize that the light emitting devices of the present invention may vary in detail from the light emitting devices of illustrative FIG. 1a. FIG. 1a includes an extension of encapsulant layer 109 to regions of the device including the side edge of multi-layer stack 115. Although that side edge may be considered to also be a luminous stack surface 114 of multi-layer stack 115, in the case shown the proximal encapsulant surface along that side edge is not patterned. One skilled in the art will further know that design decisions regarding patterning of proximal encapsulant surfaces will depend upon many considerations, including, for example, the tradeoff between additional amount of light that will be captured from a given luminous stack surface as a result of such patterning and the cost and degree of difficulty of disposing a proximal patterned encapsulant region 117, with its proximal patterned encapsulant surface 113, upon that luminous stack surface 114.

A "proximal patterned encapsulant region" 117 is a region of encapsulant layer 109 extending from "proximal patterned encapsulant surface" 113 into encapsulant layer 109 to a plane, parallel to proximal patterned encapsulant surface 113, which is the plane farthest from proximal patterned encapsulant surface 113 that still passes through a recess 112. In the same way that the distal surface of encapsulant layer 109 is defined supra, that plane is the "distal surface" of proximal patterned encapsulant region 117, and the distance, along a straight line normal to proximal patterned encapsulant surface 113, between proximal and distal patterned encapsulant surfaces of a given proximal patterned encapsulant region 117 is the "proximal patterned encapsulant region thickness" 128. Proximal patterned encapsulant region 117 has a dielectric function that varies spatially according to a pattern. All, a portion of, or none of proximal patterned encapsulant region 117 is in optical proximity to luminous stack surface 114. If proximal patterned encapsulant region 117 is directly bonded to luminous stack surface 114, typically all, or a portion of that proximal patterned encapsulant region 117 will be in optical contact with luminous stack surface 114. Proximal patterned encapsulant region 117 will typically not be in optical contact with luminous stack surface 114 if there is an intervening high refractive index layer. An "intervening high refractive index layer" (not shown in the figures) disposed between luminous stack surface 114 and proximal patterned encapsulant region 117 has a refractive index, for the wavelength of light to be extracted, that is: no lower than 0.5; 0.1; or 0.01 below; and preferably equal to or greater than the refractive index, for the wavelength of light to be extracted, of luminous stack surface 114. In one embodiment an intervening high RI layer is formed when an LED having a luminous stack surface 114 further has a high RI top layer disposed upon it prior to affixing the light extraction encapsulation sheet.

A "recess set" is the set of "recesses" 112, formed during a step of applying a filler layer 125 (see FIG. 7), a patterning step (see FIGS. 6 and 7), or a combination of steps of applying a filler layer and patterning. A recess set may contain a single recess or plural recesses. Plural recesses of a given recess set are related to each other such that they form a pattern which may be random or periodic, or a combination of random and periodic. When a recess set contains a single recess, that recess is typically a continuous layer having one or more patterned recess walls 111. In some cases, however recess 112 of a recess set containing a single recess 112 may be unpatterned (i.e., a layer that is smooth on both of its main surfaces).

"Topography" refers to the state of roughness of a surface. For example a surface may be smooth, or may have a multi-level pattern.

An "inter-recess volume element" 118 is a volume element of proximal patterned encapsulant region 117 that is derived from encapsulant block 120. Inter-recess volume element 118 includes "inter-recess filler". "Inter-recess filler" includes "encapsulant material". During formation of recesses 112 by patterning, a smooth surface of an encapsulant block may remain smooth (i.e., may not be deformed), in which case there will be no inter-recess volume element 118. Alternatively, the surface of encapsulant block 120 may be deformed, in which case a portion of the encapsulant material becomes part of proximal patterned encapsulant region 117. The volume occupied by that encapsulant material is the inter-recess volume element 118.

To illustrate that a given proximal patterned encapsulant region may contain one recess set or plural recess sets, a "first recess set" and a "second recess set" are indicated in the figures. The two illustrative sets are differentiated using numerical identifiers (see Table 1). Numerical identifiers relating to a recess or recesses 112 contained in the first recess set include the hyphenated numerical suffix "-1" (see FIGS. 1-9), while those relating to a recess or recesses 112 contained in the second recess set include suffix "-2" (see FIGS. 7 and 8). The designations of first recess and second recess are made for illustrative purposes. Therefore, it is understood that a given proximal patterned encapsulant region may include a single recess set, two recess sets, three recess sets, or more than three recess sets, with no particular limit on the number of such recess sets.

A "recess wall" 111 is a surface of recess 112 which forms a boundary of recess 112 within proximal patterned encapsulant region 117. When a recess 112 does not extend to proximal patterned encapsulant surface 113, its recess wall is a continuous boundary surrounding that recess. When a recess 112 extends to proximal patterned encapsulant surface 113 to form a recess opening 119 coincident with that surface, its recess wall is contiguous with that recess opening. "First recess walls" 111-1 (see FIGS. 1, 2, and 6-9) and "second recess walls" 111-2 (see FIG. 8) illustrate recess walls, respectively, for a first set of recesses 112-1 and a second set of recesses 112-2. It will further be recognized that there may be an "intervening high refractive index layer" ("intervening high RI layer") disposed between proximal patterned encapsulant region 117 and luminous stack surface 114.

A "recess opening" 119 is a surface of recess 112 that is coincident with proximal patterned encapsulant surface 113. As such, for a given recess, the recess opening of that recess is the boundary of that recess at proximal patterned encapsulant surface 113. "First recess openings" 119-1 (see FIGS. 3, 4, 5, and 8) and "second recess openings" 119-2 (see FIG. 8) illustrate recess openings, respectively, for a first set of recesses and a second set of recesses.

A "recess depth" 129 for a given recess 112 is a distance within that recess between first and last encounter with recess wall 111-1, along a straight line, normal to and extending from proximal patterned encapsulant surface 113. The "maximum recess depth" 130 for a given recess 112 is its largest recess depth.

A "lateral dimension" is a dimension running parallel to the plane of proximal patterned encapsulant surface 113. In FIG. 10, x-dimension and y-dimension are lateral dimensions that are perpendicular to one another.

Figure 10A:
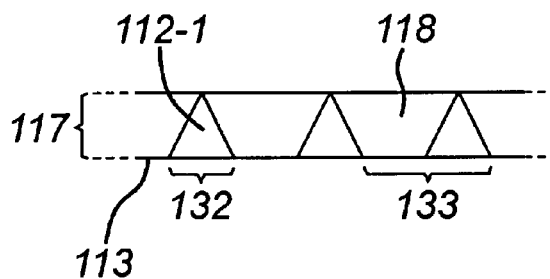
FIGS. 10a and 10c-10e are side views of proximal patterned encapsulant region 117.
Figure 10B:
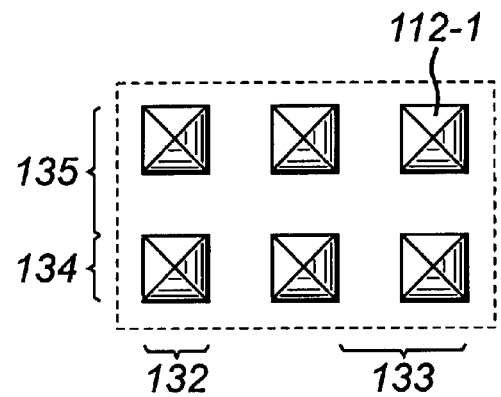
FIG. 10b is a view of proximal patterned encapsulant region 117 from a vantage point above the distal surface of region 117.
Figure 10C:
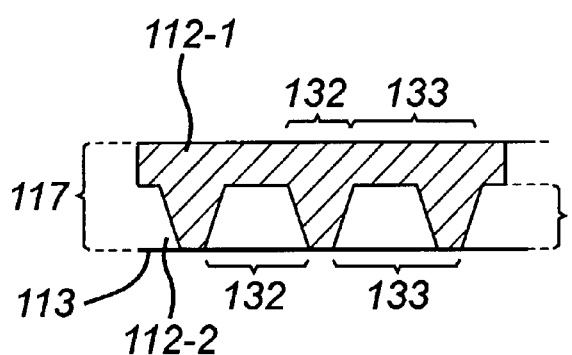
Figure 10D:
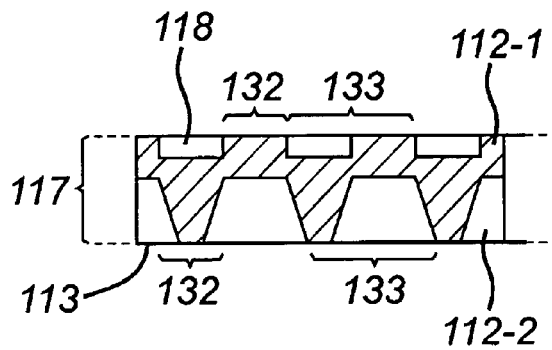
Figure 10E:
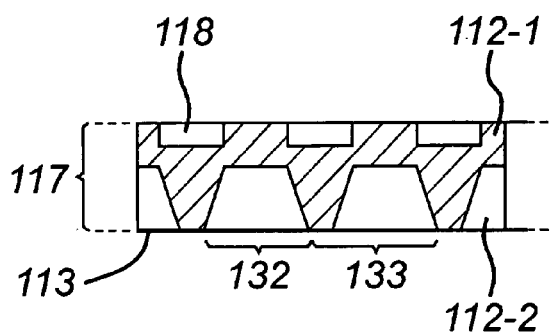

A "pattern feature size" is the size of a recess, measured in a lateral dimension, when plural recesses form a pattern (see FIGS. 10*a*, 10*b* and 10*e*, x-dimension feature size 132). Alternatively, a "pattern feature size" is the size of a feature of a pattern on a single recess, measured in a lateral dimension (see FIGS. 10*c* and 10*d*, x-dimension feature size 132).

A "pattern period" is the period of repetition of a pattern of recesses, measured in a lateral dimension, when plural recesses form a pattern (see FIGS. 10*a*, 10*b* and 10*e*, x-dimension period 133). Alternatively, a "pattern period" is the period of repetition of a pattern on a single recess, measured in a lateral dimension (see FIGS. 10*c* and 10*d*, x-dimension feature size 132).

A "recess filler" is a material included in a recess 112. Recess 112 may be completely filled with a single recess filler, or may be partially filled with each of two or more recess fillers.

A "light extraction encapsulation sheet" is a free standing sheet identical to an encapsulant layer having a proximal patterned encapsulant region. By "sheet" is meant any film of thickness appropriate to encapsulate a light emitting device. There are no particular limits to the lateral (in-plane) dimensions of a sheet. Typically, the thickness of a sheet will be: at least 1 micron, at lest 10 microns, or at least 100 microns; and no more than 10,000 microns, or no more than 1,000 microns, Although the light extraction encapsulation sheet is suitable for being affixed to a luminous stack surface of a multi-layer stack, it has not yet been affixed to that multi-layer stack. The term "proximal patterned encapsulant region" is used in reference to the patterned region of the light extraction encapsulation sheet to indicate that it is that region which may later be affixed to a luminous stack surface of a multi-layer stack.

A "cover slip" 127 is a layer of transparent material having a surface disposed upon a distal surface of encapsulant layer 109 and a surface typically in contact with air, or other environment external to light emitting device 100. One skilled in the art will recognize that the presence of cover slip 127 in a light emitting device is optional.

An "exterior stack surface" of multi-layer stack 115 is a surface which is part of that stack, and beyond which that stack does not extend. Luminous stack surface 114 is an example of an exterior stack surface.

An "auxiliary light transmitting layer" 131 is an optional layer of multi-layer stack 115 that is non-absorbing, or substantially non-absorbing, with respect to wavelengths of light generated within multi-layer stack 115 which are desired to be included in the light emitted by light emitting device 100. An "exterior auxiliary transmitting surface" of auxiliary light transmitting layer 131 is a surface of that layer which is a luminous stack surface 114. The light emitting device represented in FIG. 9 has multi-layer stack 115 which includes an auxiliary light transmitting layer 131 which has more than one exterior auxiliary transmitting surface. In FIG. 9, two of those exterior auxiliary transmitting surfaces are luminous multi-stack surfaces 114, each having a proximal patterned encapsulant region 117 disposed upon it. A third exterior auxiliary transmitting surface is also a luminous stack surface 114, however, that surface has reflective surface 103 disposed upon it. Therefore, a luminous stack surface 114 may or may not have a proximal patterned encapsulant region 117 disposed upon it. It is further noted that, although two of the exterior auxiliary transmitting surfaces depicted in FIG. 9 as encapsulated appear to be two different surfaces, those apparently different surfaces could be separate, or could be part of the same surface, as might be the case for a circular light emitting device.

A "phosphor layer" which includes a phosphor, may be used to change the frequency of light generated in light generating layer 106. An example of "phosphor host" is YAG (yttrium aluminum garnet, $Y_3Al_5O_{12}$). Typical phosphor emitters are, for example, cerium (Ce), neodymium (Nd), and erbium (Er). YAG:Ce is excited by blue light with a wavelength of 460 nm and radiates yellow excited light with a wavelength of 520 to 550 nm The yellow excited light is mixed with blue light, thereby generating white light. A phosphor layer is positioned so that light emitted by luminous stack surface 114 encounters that phosphor layer before exiting the light emitting device. Phosphor layers typically contain particles on size on the order of a micron or more, and tend to be rough. If a micron scale phosphor layer is utilized to change the frequency of light exiting luminous stack 114 of the present invention, that micron scale phosphor layer will be positioned at a distance from luminous stack surface 114 that is greater than the distance to the distal surface of proximal patterned encapsulant region 117. Phosphors typically include mixtures of rare earth elements, the compositions and ratios of which are adjusted based upon the wavelength of light generated in light generating layer 106 and upon the desired output wavelength. A non-exhaustive list of phosphors includes: YAG:Ce; nitride silicates:Eu; Sr-Aluminate:Eu; thiogallates; ZnS:Cu, $YBO_3$; and $LaBO_3$. A non-exhaustive list of specific phosphors, and their output wavelengths, includes: $(Y,Gd)_3(Al,Ga)_5O_{12}$:Ce; $SrB_4O_7$:Eu (368 nm); $Sr_2P_2O_7$:Eu (420 nm); $BaMgAl_{10}O_{17}$:Eu (453 nm); $Sr_4Al_{14}O_{25}$:Eu (490 nm); $Ba_2SiO_4$:Eu (505 nm); $SrGa_2S_4$:Eu (535 nm); $Sr_2SiO_4$:Eu (575 nm); SrS:Eu (615 nm) and combinations thereof.

Alternatively, a recess may include a recess filler which includes plural nanophosphors. In such case, the nanophosphors are located within proximal patterned encapsulant region 177. Nanophosphors are phorphor particles having a mean particle diameter of: at least 1 nm; at least 2 nm, or at least 5 nm; and no more than 50 nm, no more than 30 nm, no more than 20 nm, no more than 10 nm.

"Planarization" refers to any method that causes a smooth surface to be formed within or upon a proximal patterned encapsulant surface. Spin coating and sputtering techniques are useful methods to achieve planarization. Planarization can also be achieved by filling in recesses in a surface with a fluid recess filler and then removing excess with, for example, a doctor blade, typically followed by a curing process. Planarization can also be achieved with abrasive pads.

It will be recognized by one of skill in the art that multi-layer stack 115 is well known. It will further be recognized that use and placement of: reflective layer 103 to redirect light; submount 101 to provide positional and dimensional stability; bonding layer 102 to affix adjacent layers to one another; and cover slip 127 will vary from device to device, and that any of these are optional based upon design requirements of a given light emitting device 100. Further, additional layers may be included within multi-layer stack 115. These additional layers may include, but are not limited to: metallic electrodes, transparent electrodes such as those made from indium tin oxide ("ITO"), and phosphor layers.

It will be further recognized by one of skill in the art that light emitting device 100 is illustrative of light emitting devices of the present invention, and that such devices may vary substantially in the details of design.

Proximal patterned encapsulant surface 113 of encapsulant layer 109 is indented with a first recess or first recesses 112-1 arranged in a pattern. The pattern can be a periodic pattern, a random pattern, or a combination of periodic and random pattern. When a pattern is periodic, the pattern may be periodic: in a first dimension along proximal patterned encapsulant surface 113; in a second dimension, perpendicular to the first dimension, along proximal patterned encapsulant surface 113; in a third dimension normal to proximal patterned encapsulant surface 113; or any combination. That is, a pattern may be periodic in one, two, or three dimensions. First recess 112-1 can have a regular shape or an irregular shape. When proximal patterned encapsulant region 117 includes plural first recesses 112-1, all of those first recesses may be identical in size and shape, or individual first recesses may vary in size, shape, or both. When first recess shapes are selected from two or more regular shapes and the pattern is a periodic pattern, first recesses having a particular regular shape can be distributed in a periodic "subpattern" which may or may not have a periodic relationship to first recesses having different shapes. Alternatively, when first recess shapes are selected from two or more regular shapes, and the pattern is a periodic pattern, first recesses having a particular regular shape can be distributed in a random "subpattern". The first recess shape of a first recess of the present invention can also be irregular and recurring according to periodic or random pattern. When first recess shapes are selected from two or more irregular shapes, the pattern formed by those first recesses is a periodic pattern, first recesses having a particular irregular shape can be distributed in a periodic or random subpattern. In addition, first recesses having regular shapes can be interspersed with first recesses having irregular shapes to form a random or periodic pattern, which itself include subpatterns formed by first recesses having a particular shape. Further, first recesses having identical first recess shapes, but which differ in size can be present at the proximal patterned encapsulant surface.

The patterns represented by FIGS. 3a, 3c, 3d, and FIGS. 5a-5e are a non-exhaustive group of illustrative periodic patterns for the proximal patterned encapsulant surface 113. The pattern represented by FIG. 3b represents a random pattern. Any type of pattern of first recesses and of first recess shapes and sizes may be selected, based upon such considerations as resulting efficiency of light extraction and ease of forming the pattern.

Similarly, any first recess shape may be selected, based upon such considerations as resulting efficiency of light extraction and ease of forming the first recess. The first recesses represented by FIGS. 2a-2c, 2e, and 2f have regular shapes, while the first recesses represented by FIG. 2d have random shapes. The first recess shapes of FIGS. 2a-2f are a non-exhaustive group of representative first recess shapes. FIGS. 4a, 4c, 4e, and 4g (side view) exemplify regular first recess shapes. FIGS. 4b, 4d, 4f, and 4h represent first recess openings 119-1, respectively, of the first recesses 112-1 of FIGS. 4a, 4c, 4e, and 4g at proximal patterned encapsulant surface.

A luminous stack surface 114 of the light emitting device of the present invention may be an unpatterned surface or a patterned surface. When luminous surface 114 is patterned, the pattern is conveniently selected from any of the patterns disclosed herein for proximal patterned encapsulant layer 109. A luminous stack surface 114 may be patterned, for example using laser ablation. When the luminous stack surface of the present invention is patterned, it may or may not be desirable to align a pattern of proximal patterned encapsulant regions 117 with that luminous stack surface 114 pattern. An intervening high RI layer (not shown in the figures) may further be disposed upon the luminous stack surface 114. The intervening high RI layer may be smooth or patterned on either of its lateral surfaces. The intervening high RI layer may be grown, for example, epitaxially on luminous stack surface 114 using any of the types of high RI material disclosed herein for preparation of, for example, the multi-layer stack 115, the submount 101, or high RI recess filler. The intervening high RI layer may include, alternatively or additionally, a high RI bonding material (see infra).

An "evanescent tail" is that portion of the optical field of a light wave, typically generated by light generating layer 106, which exists just outside multi-layer stack 115 at a distance from luminous stack surface 114 that is within the optical contact distance. When a portion of the proximal patterned encapsulant region 117 of the present invention is in optical contact (typically within 50 nm) with luminous stack surface 114, proximal patterned encapsulant region 117 is designed to capture light from the evanescent tail.

For a given wavelength of light, the "optical contact distance" is a distance, along a straight line normal to luminous stack surface 114, beginning at luminous stack surface 114 and extending into proximal patterned encapsulant region 117 to the first point along that line which is no longer in optical contact with luminous stack surface 114. That straight line is an "optical contact measurement line". The optical contact distance is given by Equation 1, $$d = \lambda/2\pi(n_2^2 - n_1^2) \quad \text{(Equation 1)},$$

wherein: $\lambda$ is a wavelength of light emitted from luminous stack surface 114; $n_2$ is the refractive index of a layer (e.g., n-doped layer 107) having luminous stack surface 114; and $n_1$ is the average refractive index of recess filler and inter-recess filler. Because the optical contact distance is dependent upon wavelength $\lambda$, there will be multiple contact distances, d, along a given optical contact measurement line, with the breadth of the range of optical contact distance, d, depending upon the breadth of wavelengths, $\lambda$, in optical contact with proximal patterned encapsulant region 117. The optical contact distance, d, increases with increasing wavelength, $\lambda$. When the refractive index of recess filler or inter-recess filler is encountered along a given optical contact measurement line, the refractive index, $n_1$, is the distance weighted average of the refractive indices of materials encountered along that straight line. For a given wavelength, $\lambda$, the optical contact distance, d, decreases as the difference $n_2 - n_r$ increases. Table 2 lists values calculated, according to Equation 1, for optical contact distance, d. The wavelengths selected for use in Table 2 calculations bracket the wavelengths associated with near ultraviolet (200 nm-400 nm), visible (400 nm-800 nm), and near infrared (800 nm-2000 nm) light. Refractive index values, $n_1$ and $n_2$, represent the range of such values typically encountered in materials of fabrication of the light emitting devices of the present invention.

TABLE 2

| λ, nm | Optical contact distances calculated according to Equation1. | | | | | | | | | | | |
|---|---|---|---|---|---|---|---|---|---|---|---|---|
| | 200 | | | 400 | | | 800 | | | 2000 | | |
| $n_1$ | 1.0 | 1.5 | 2.0 | 1.0 | 1.5 | 2.0 | 1.0 | 1.5 | 2.0 | 1.0 | 1.5 | 2.0 |
| $n_2$ | 3.5 | 2.5 | 2.5 | 3.5 | 2.5 | 2.5 | 3.5 | 2.5 | 2.5 | 3.5 | 2.5 | 2.5 |
| d, nm | 9 | 16 | 21 | 19 | 32 | 42 | 38 | 64 | 85 | 95 | 159 | 212 |

"Refractive index", "n", is the ratio of the speed of light in a medium to that in a vacuum. The speed of light in a material is given by c/n, wherein c is the speed of light in a vacuum.

For a given wavelength of light, λ, a point outside of multi-layer stack 115 is in "optical proximity" to luminous stack surface 114 if the distance of that point from luminous stack surface 114, along an optical contact measurement line, is no greater than the optical contact distance.

The recess set is a set one or more recesses including recess filler. A first recess set includes one or more first recesses wherein the first recesses include first recess filler. A second recess set includes one or more second recesses wherein the second recess includes second recess filler. The proximal patterned encapsulant region of the present invention includes at least one first recess filler that differs in refractive index from at least one of second recess filler and inter-recess filler by at least 0.001, at least 0.01, at least 0.1, or at least 0.5; and no more than 3.0, no more than 2.5, no more than 1.5, no more than 1.0, or no more than 0.8.

"Imprinting" is a process of indenting film using a mold that has features on its surface arranged in a multi-level pattern, thereby forming a relief pattern on the film.

"Nano-imprinting" is imprinting in which at least one feature size is typically no more than 200 nm.

A "positioning index" is a reference point in or on a light emitting device, a layer of a light emitting device, a surface of a layer of a light emitting device, or an "assembly stage" used to position a light emitting device during assembly. In fact, a positioning index may be located anywhere that will serve as a reference position for assuring desired positional relationships during assembly of a light emitting device. One or more positioning indices may, for example, be relied upon to assure that the desired positional relationships are achieved between luminous stack surface 114 and proximal patterned encapsulant region 117, and among patterns within proximal patterned encapsulant region 117.

An "encapsulant block" 120 is a block of encapsulant material which is patterned during formation of an encapsulant layer having a proximal patterned encapsulant region 117. There is no particular restriction upon the dimensions of encapsulant block 120. Encapsulant block 120 may, for example, be of a length, width and thickness appropriate for encapsulation of a single light emitting device 100, or appropriate for encapsulation of an array of such devices. Encapsulant block 120 may, further, be in the form of a free standing film. Such free standing film may, for example, be of such length as to be suitable for rolling into a roll for later application to encapsulate a light emitting device, or to be applied to an array of light emitting devices having dimensions similar to those of the free standing encapsulant block film. Encapsulant block 120 may be, for example: planarized, or otherwise dimensionally modified, to remove removal excess encapsulant material, first recess filler, and/or second recess filler; and may be diced, or otherwise divided, into smaller encapsulant blocks prior to, during, or after its conversion to encapsulant layer 109. When the term "proximal encapsulant block surface" is used, it is understood that, although an encapsulant block surface will typically not be attached to, nor specifically oriented with respect to, a specific luminous stack surface 114 during modification of the encapsulant block surface. Therefore, the use of "proximal" with regard to a surface of encapsulant block 120 simply identifies that surface as a surface which will be, or is being, converted into a proximal patterned encapsulant surface 113.

In some embodiments of the present invention, a portion or all of the encapsulant material of the encapsulant block is removed after patterning. When all of the encapsulant material is removed (for example, when the encapsulant material acts as a "release agent"), the distal surface of one or more recesses becomes the distal surface of the encapsulant layer.

"Patterned mold" 122 has "mold patterned surface" 123 having mold protrusions 124. having "mold peaks" ("peaks"). It will be understood that mold protrusions 124 are accompanied by "mold depressions" having "mold valleys" ("valleys"). This combination of protrusions and depressions on mold surface 123 defines the "mold pattern" which, when patterned mold 122 is brought into contact with encapsulant block 120, or block 120 coated with first recess filler, second recess filler, or both, forms a relief pattern.

Proximal patterned encapsulant region 117 has a dielectric function that varies spatially according to a pattern, and, absent any intervening high refractive index layer, is in optical proximity to luminous stack surface 114 (which is n-doped layer surface 114 in FIG. 1) of multi-layer stack 115. Without wishing to be bound by any particular theory, it is believed that the presence of proximal patterned encapsulant region 117 in optical proximity to luminous stack surface 114 has the effect of directing light present in multi-layer stack 115 into encapsulant layer 109. It is believed that the presence in region 117 of a dielectric function that varies spatially according to a pattern facilitates capture of light from the evanescent tail of the light contained in, for example, n-doped layer 107 (higher refractive index) and guidance of that light into the encapsulant layer (lower refractive index). It is necessary that proximal patterned encapsulant region 117 have a dielectric function that varies spatially according to a pattern so that light will be scattered into encapsulant layer 109 and guided toward the distal surface of encapsulant layer 109, thereby increasing the efficiency of light emitting device 100.

When multi-layer stack 115 is inorganic, it may be made from a variety of materials depending on the desired emission wavelength. A non-exhaustive list of such materials includes: GaN, AlGaInN, GaAsP, GaP, AlGaAs/GaAs, AlGaInP/GaAs, AlGaN, GaInN, and ZnO. Light emission occurs in the light generating layer where recombination of holes and electrons results in light emissions. Substrates upon which multi-layer stack 115 is grown include GaAs, GaN, SiC, and sapphire. Growth of layers is typically accomplished by metal organic chemical vapor deposition (MOCVD) at elevated temperatures. U.S. patent application 2005/0141240 A1 discloses preparation of inorganic multi-layer stacks.

The multi-layer stack 115 represented in FIGS. 1 and 2 is made of inorganic material. However, multi-layer stack 115 may also be organic or polymer organic. Organic light emitting devices (OLEDs) and polymer organic light emitting devices (POLEDs) typically include: an anode (e.g., indium tin oxide, ITO); a conducting polymer layer or small molecule conducting layer; an emissive polymer or emissive small molecule layer; and a cathode (e.g., Ba/Ca/Al). The cathode injects electrons into the light emissive polymer and the anode injects holes into the conducting polymer layer. When the holes and electrons combine, light is given off. A non-exhaustive list of conductive polymers includes polyaniline and polyethylenedioxythiophene. Examples of emissive polymers include polyphenylenevinylene and polyfluorene. Examples of small molecules suitable for hole transport include metal phthalocyanines and arylamines. Examples of small molecules suitable for emissive layers include metal chelates, distyrylbenzene, and fluorescent dyes. In addition, it is advantageous to add charge transport molecules such as fullerenes.

Reflective layer 103 may be a metallic layer including, for example, Ag, Al, and Au. Alternatively, reflective layer 103 can be a periodic arrangement of dielectric mirror layers which are high and low refractive index layers functioning to back scatter light in the direction from which it first impinged upon the periodic dielectric mirror. A Bragg mirror is an example of a periodic dielectric mirror.

Extraction of light of wavelength in the range 200-400 nm is advantageously achieved when a feature of a pattern has a feature size in at least one lateral dimension of: at least 5 nm, at least 10 nm, at least 20 nm, or at least 30 nm; and no more than 5,000 microns, no more than 100 microns, no more than 10 microns, no more than 500 nm, no more than 200 nm, no more than 100 nm, or no more than 50 nm. Extraction of light of wavelength in the range 400-800 nm is advantageously achieved when a feature of a pattern has a feature size in at least one lateral dimension of: at least 10 nm, at least 20 nm, at least 40 nm, or at least 60 nm; and no more than 5,000 microns, no more than 100 microns, no more than 10 microns, no more than 1000 nm, no more than 300 nm, no more than 150 nm, or no more than 80 nm. Extraction of light of wavelength in the range 800-1000 nm is advantageously achieved when a feature of a pattern has a feature size in at least one lateral dimension of: at least 25 nm, at least 50 nm, at least 100 nm, or at least 200 nm; and no more than 5,000 microns, no more than 100 microns, no more than 10 microns, no more than 500 nm, no more than 2000 nm, no more than 1000 nm, no more than 500 nm, or no more than 300 nm.

Maximum recess depth 130 may fall within the ranges given supra for feature sizes in at least one lateral dimension. However, there is no particular limit to maximum recess depth 130 other than that it cannot be greater than the thickness of encapsulant layer 109 at its thickest point. Therefore, the maximum recess depth 130 will typically be at least 25, at least 50, or at least 100 nm; and no more than 10,000 microns, no more than 1,000 microns, no more than 100 microns, no more than 10 microns, or no more than 2 microns.

A pattern of the present invention may be random or periodic. When a pattern is periodic, that pattern may be periodic in at least one of x-dimension, y-dimension, and z-dimension. Extraction of light of wavelength in the range 200-400 nm is advantageously achieved when a periodic pattern has a period in at least one lateral dimension (e,g, x-dimension period 133 and y-dimension period 135 in FIG. 10) of: at least 10 nm, at least 50 nm, at least 70 nm, or at least 100 nm; and no more than 5,000 microns, no more than 100 microns, no more than 10 microns, no more than 500 nm, no more than 375 nm, no more than 300 nm, or no more than 200 nm. Extraction of light of wavelength in the range 400-800 nm is advantageously achieved when a periodic pattern has a period in at least one lateral dimension of: at least 20 nm, at least 100 nm, at least 140 nm, or at least 200 nm; and no more than 5,000 microns, no more than 100 microns, no more than 10 microns, no more than 1000 nm, no more than 750 nm, no more than 600 nm, or no more than 400 nm. Extraction of light of wavelength in the range 800-2000 nm is advantageously achieved when a periodic pattern has a period in at least one lateral dimension of: at least 50 nm, at least 2000 nm, at least 280 nm, or at least 400 nm; and no more than 5,000 microns, no more than 100 microns, no more than 10 microns, no more than 2000 nm, no more than 1875 nm, no more than 1500 nm, or no more than 1000 nm.

"Encapsulant material" may be any material that is transparent to the wavelengths of light. A non-exhaustive list of encapsulant materials includes: polysiloxanes such as polyphenylsiloxanes, other polyarylsiloxanes, poly(aryl-oxy-aryl)siloxanes, and poly(aryl-thio-aryl)siloxanes, polysilyl benzene, poly(methyl methacrylate) and other poly (alkyl (meth)acrylates), polycarbonate, cyclic olefin copolymers, amorphopus PET, polyimides, polyphosphazene, polyamides, polysulphones, polyphenyl sulphones, polyether sulphones, polycarboranes, polyadamantane, and their copolymers. Suitable encapsulant materials further include cured B-staged optical materials disclosed infra. These cured B-staged materials may be encapsulant materials or recess filler, or both. The distribution of "pores" ("nanoholes") within the cured B-staged optical material may be uniform [i.e., the porosity ("pore volume") is the same, or substantially the same, throughout the cured B-stage optical material. Alternatively the distribution of pores may vary discretely in a series of adjoining recesses (e.g., varying by at least 0.01 unit of refractive index, based on the wavelength of light to be extracted) or may be continuous (i.e., having regions of variation of refractive index wherein the RI varies smoothly). An example of a suitable continuous refractive index variation would be one in which the density of pores decreased continuously from 1 volume percent to 90 volume percent moving away from proximal patterned encapsulant surface 113, at a rate of no more than 1 volume percent per 10 nm. For this example, that rate of porosity (pore volume) change would translate into a refractive index change of no more than 0.004 per 10 nm.

A "recess filler" of the present invention may be any material that is transparent to the wavelengths of light generated within multi-layer stack 115 which are desired to be extracted, providing that material can be fabricated to fill recesses in such a way that design specifications for the desired light emitting device are met. A non-exhaustive list of polymers suitable as recess filler includes: silsesquioxane polymers having n~1.4 and containing porogens; B staged silsesquioxane polymers having n=1.05 to 1.4; polysiloxanes such as polyphenylsiloxanes, other polyarylsiloxanes, poly (aryl-oxy-aryl)siloxanes, and poly(ary-thio-aryl)siloxanes, polysilyl benzene, poly(methyl methacrylate), polycarbonate, cyclic olefin copolymers, amorphous PET, polyimides, polyphosphazenes, polyamides, polysulphones, polyphenyl sulphones, polyether sulphones, polycarboranes, polyadamantane, and their copolymers. When a recess filler is a polysiloxane, that polysiloxane may have a high content of phenyl or other aromatic groups. That polysiloxane may further contain inorganic material such as metal oxides which may be copolymerized or may be present as metal containing particles. A suitable recess filler may further be an inorganic material, a non-exhaustive illustrative list of which includes: ZnS, ZnSe, TiO2, GaP, GaAs, InGaP, GaN, CdS, CdTe, ZnTe, Si, and Ge. Suitable recess filler may also be high refractive index glass such as chalcogenide glasses, phosphate glasses, and flint glasses. These high refractive index glasses include, for example, Pb, La, Nb, and Ba. These inorganic recess fillers may be deposited onto encapsulant surfaces and recess walls by a variety of techniques known in the art, such as metal organic vapor deposition (MOCVD), physical vapor deposition (PVD), hydride vapor phase epitaxy (HVPE), atomic layer deposition (ALD), the use of low melting point glasses, and sol gel techniques.

An "optical adhesive" useful as a recess filler of the present invention is any fluid material having a very low viscosity (typically no more than 100 centipoise) which may be applied to a surface during preparation of the proximal patterned encapsulant region, during bonding of that region to a luminous stack surface, or both. The optical adhesive must be able to form a film having a thickness of no more than 10 nm. The optical adhesive should be curable by some means, including, but not limited to, polymerization and crosslinking, wherein that curing is accomplished through application of, for example, heat or UV light. When heat is applied, a thermal initiator (e.g., a peroxide or an azo initiator) may be present in the optical adhesive. When UV light is applied, a photosensitizer such a benzophenone may be present. A non-exhaustive list of optical adhesives include alkyl (meth)acrylate monomers such as those available from Norland (Cranbury, N.J.). In one embodiment, an optical adhesive is applied to as a recess filler layer that is a continuous recess of proximal patterned encapsulant region 117, and which is disposed directly upon luminous stack surface 114. In another embodiment, an optical adhesive is applied to a patterned surface of proximal patterned encapsulant region 117 during formation of that region such that the optical adhesive fills recesses in that surface. Excess optical adhesive is then removed from that surface leaving a recess set having recesses including recess filler which is optical adhesive. In this case, the optical adhesive is present at recess openings 119 in proximal patterned encapsulant surface 113, and thereby available for bonding proximal patterned encapsulant region 117 to luminous stack surface 114.

Details of the necessary degree of bonding needed for optical contact (and therefore low light loss between two media) is: J. Haisma, G.A.C.M. Spierings, Mat. Sci. Eng. R (2002), Vol 37, pp. 1-60.

One of skill in the art will recognize that, as the refractive index of the bonding material approaches that of the light emitting layer, or any intervening layer between the light emitting layer and the bonding surface, the thickness of the bonding layer may increase beyond 10 nm, 30 nm, or even 50 nm without significant loss of light transmission from the high refractive index LED stack through the bonding layer. A variety of higher RI adhesives are known. Sol-gel based adhesives have been employed for bonding, as disclosed in U.S. Pat. No. 5,516,388. In U.S. Pat. No. 5,516,388, it is disclosed that a variety of sol-gel precursors of $SiO_2$, $TiO_2$, $HfO_2$, $YO_2$, or $Al_2O_3$ may be used to effect bonding of surfaces such as glasses, metals, or semiconductors. These adhesives have the advantage of being higher in refractive index than organic-based adhesives. Furthermore very thin layers of the sol-based materials may be used (<50 nm), producing excellent optical coupling.

U.S. Pat. No. 7,053,419B1 disloses many methods of bonding two surfaces together via contact: thermocompression, cold-welding, oxide assisted, or other bonding techniques. The disclosure also specifies polymeric adhesives when the thickness is below 50 nms, so that light can couple between layers. U.S. Pat. No. 6,709,883 mentions the use of a BCB (B-staged bisbenzocyclobutene) or epoxy resin to bond a lens to a LED surface. U.S. Pat. No. 6,682,950 mentions the use of spin-on-glasses ($SiO_2$ sol precursors typically), silicones, or polyimides as an adhesive layer. These lower RI adhesives will result in excellent optical coupling if the adhesive thickness is below ~50 nm.

An illustrative non-exhaustive list of sol-gel precursors that produce high refractive index bonding layers includs: a silicon tetra-alkoxide, such as $Si(OCH_3)_4$, $Si(OC_2H_5)_4$, $Si(i-OC_3H_7)_4$, and $Si(t-OC_4H_9)_4$; a single metal alkoxide, such as $ZrSi(OCH_3)_4$, $Zr(OC_2H_5)_4$, $Hf(OC_2H_5)_4$, $VO(OC_2H_5)_3$, $Nb(OC_2H_5)_5$, $Ta(OC_2H_5)_5$, $Si(OC_4H_9)_4$, $Al(OCH_3)_3$, $Ti(OCH_3)_4$; a double metal alkoxide, such as $La[Al(iso-OC_3H_7)_4]_3$, $Mg[(Al(iso-OC_3H_7)_4]_2$, $Ni[Al(iso-OC_3H_7)_4]_2$, $Ba[Zr_2(C_2H_5)_9]_2$, $(OC_3H_7)_2Zr[Al(OC_3H_7)_4]_2$; and a polymetal alkoxide containing three or more kinds of metals.

The metal alkoxide solution used for bonding might include the following precursors in a suitable solvent: tetramethoxysilane, tetraethoxysilane, tetraisopropoxysilane, tetra(t-butoxy)silane, $Zr(OMe)_4$, $Zr(OEt)_4$, $Zr(OBu)_4$, $Hf(OEt)_4$, $Hf(OBu)_4$, Tyzor™ from Dupont (various alkoxides of titanium). In general alkoxide precursors of Ti, Zr, Si, Hf, V, Nb, Ta, Al, Mg, La, and other suitable transparent or mostly transparent metal oxides can be used. Double metal alkoxides such as $La[Al(i-PrO)_4]_3$, or polymetalalkoxide compounds can also be used. Other volatile leaving groups such as low molecular weight amines, carboxylates, β-diketones (acetylacetonate, acac), etc. can be used with suitable metal atoms to provide the hydrolyzable metal oxide precursor. For instance, $Ti(acac)_2$ might be employed.

The recess filler of the present invention may further be a low refractive index "B-staged optical material" as disclosed in U.S. Pat. No. 6,967,222. A B-staged optical material is prepared by: a) combining a plurality of porogen particles and a B-staged optical material; b) at least partially curing the B-staged optical material; c) at least partially removing the plurality of porogen particles; and d) defining a path for transmitting light through the optical material. The porogen particles are typically crosslinked, although they may be uncrosslinked if they are not swollen by the B-staged optical material. The mean particle diameter of the porogen particles is at least 1 nm, at least 2 nm, or at least 5 nm; and no more than 50 nm, no more than 30 nm, no more than 20 nm, or no more 10 nm. The term "porogen" refers to a pore forming material that is a polymeric material or particle dispersed in an optical material and that is subsequently removed to yield pores, voids, or free volume in the dielectric material. Thus the terms "removable porogen", "removable polymer" and "removable particle" are used interchangeably herein. "Pore" refers to a vacuum or gas-filled volume element within a solid material. Such pores may have a variety of shapes. The terms "pore", "void", and "free volume" are used interchangeably herein. The term "B-staged" refers to uncured materials. By "uncured" is meant any material that can be polymerized or cured, such as by condensation, to form higher molecular weight materials, such as coatings, or films, or recess filler. Such B-staged material may be monomeric, macromonomeric, oligomeric or mixtures thereof. B-staged material is further intended to include mixtures of polymeric material with monomer, macromonomer, oligomer, or a mixture of monomer and oligomers. "Optical matrix material or "optical material" refers to a material that is optically transparent to the wave length of use. A "curable B-staged optical material"

is a B-staged optical material that has not yet been cured. A "cured B-staged optical material" is the material that results from the curing of a B-staged optical material.

A recess filler can be a B-staged optical material that is an organo polysilica resin that is a hydrolyzate or partial condensate of one or more silanes of formulae (I) or (II):

$$R_aSiY_{4-a} \quad (I)$$

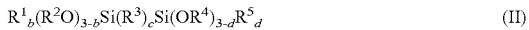

$$R^1{}_b(R^2O)_{3-b}Si(R^3)_cSi(OR^4)_{3-d}R^5{}_d \quad (II)$$

wherein R is hydrogen, $(C_1-C_{24})$alkyl, aryl, and substituted aryl: Y is any hydrolysable group; a is an integer of 0 to 2; $R^1$, $R^2$, $R^4$ and $R^5$ are independently selected from hydrogen, $(C_1-C_{24}$ alkyl, aryl, and substituted aryl; $R^3$ is selected from $(C_1-C_{18})$alkyl, $-(CH_2)_h-$, $-(CH_2)_{h1}-E_k-(CH_2)_{h2}-$, $-(CH_2)h-Z$, arylene, substituted arylene, and arylene ether; E is selected from oxygen, $NR^6$ and Z; Z is selected from aryl and substituted aryl; $R^6$ is selected from hydrogen, $(C_1-C_8)$ alkyl, aryl and substituted aryl; b and d are each an integer of 0 to 2; c is an integer of 0 to 6; and h, h1, h2, and k are independently an integer from 1 to 6; provided that at least on of R, $R^1$, $R^3$, and $R^5$ is not hydrogen. "substituted aryl" and "substituted arylene" refer to an aryl or arylene group having one or more of its hydrogens replaced by another substituent group, such as cyano, hydroxy, mercapto, halo, or $(C_1-C_6)$ alkyl, $(C_1-C_6)$alkoxy.

Further hydrolyzates or partial condensates of compounds of formula (I) are B-staged organo polysilica resins having formula (III):

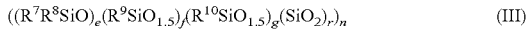

$$((R^7R^8SiO)_e(R^9SiO_{1.5})_f(R^{10}SiO_{1.5})_g(SiO_2)_r)_n \quad (III)$$

wherein $R^7$, $R^8$, $R^9$, and $R^{10}$ are independently selected from hydrogen, $(C_1-C_{24})$alkyl, aryl, and substituted aryl; e, g and r are independently a number from 0 to 1; f is a number from 0.2 to 1: n is an integer from 3 to 10,000; provided that e+f+g+r=1; and provided that at least one of $R^7$, $R^8$, and $R^9$ is not hydrogen. Preferred alkyls for any of $R^7$, $R^8$, $R^9$, and $R^{10}$ are $(C_1-C_6)$alkyls. In the above formula (III), e, f, g and r represent the mole ratios of each component. Such mole ratios can be varied between 0 and 1. It is preferred that e is from 0 to 0.8. It is also preferred that g is from 0 to 0.8. It is further preferred that r is from 0 to 0.8. In the above formula, n refers to the number of repeat units in the B-staged material. Preferably, n is an integer from 3 to 1000.

A wide variety of porogens are suitable for use in the B-staged optical material of the present invention. For example, while solvents may function as porogens, it is difficult to control the resulting pore size and pore size distribution using them. Accordingly, polymers are preferred porogens. The polymer useful as a porogen is a polymer that is removable. By "removable" it is meant that the polymer particles depolymerize, degrade or otherwise break down into volatile components which can then diffuse through the host optical material. Suitable polymers include, but are not limited to: cross-linked polymer particles, hyper-branched polymer, block copolymers, and linear polymers. Crosslinked polymer particles are preferred. Preferred crosslinked polymer particles are those disclosed in European Patent Application 1 088 848 (Allen, et al.) and U.S. Pat. No. 6,271,273 (You, et al.). Suitable polymer porogens include poly(olefin sulfones), nitrocellulose polymers and polysilynes.

The crosslinked polymer particles useful as porogens include as polymerized units one or more ethylenically or acetylenically unsaturated monomers and one or more crosslinking agents. Suitable unsaturated monomer include, but are not limited to: (meth)acrylic acid, (meth)acrylamides, alkyl (meth)acrylates, alkenyl (meth)acrylates, aromatic (meth)acrylates, vinyl aromatic monomers, nitrogen-containing compounds and their thio-analogs, cyclic olefin polymers and substituted ethylene monomer. Such monomers may optionally be substituted.

In preparing porous optical devices of the present invention, the porogens described above are first combined with, for example, as dispersed within or dissolved in, a B-staged optical material. The amount of porogen used will be that amount necessary to provide the desired porosity or free volume, and hence refractive index. Porosity is a measure of the volume fraction of pores in a cured B-staged optical material. The higher the level of porosity, the lower the index of refraction. The porosity, expressed in volume percent, is: at least 0.1, at least 1, at least 5, at least 10, at least 20, or at least 30 volume percent; and no more than 95, no more than 90, no more than 80, no more than 70, no more than 60 volume percent, based on the volume of the cured B-stage optical material. The density of a recess filler that is a cured B-staged optical material is: at least 0.03, at least 0.10, at least 0.20, or at least 0.30; and no more than 1.0, no more than 0.9, no more than 0.8, no more than 0.70, or no more than 0.60. The refractive index of a recess filler that is a cured B-staged optical material is: at least 1.01, at least 1.04, at least 1.08, at least 1.12, and no more than 1.6, no more than 1.8, no more than 1.4, no more than 1.34, no more than 1.30. These and other refractive indices herein are based on the wavelength of light emitted by the light emitting surface of the multi-layer stack for which extraction is desired.

The paragraphs immediately following recite illustrative embodiments of the light emitting device of the present invention, and of the method of making that device. It is understood that, while these embodiments are illustrative of the present invention, they by no means represent all possible embodiments of either the device or the method of making the device of the present invention.

In a first embodiment (see FIG. 1) of the light emitting device of the present invention, encapsulant region 117 is disposed upon luminous stack surface 114 such that proximal patterned encapsulant surface 113 is in direct contact with luminous stack surface 114. Proximal patterned encapsulant region 117 includes a first recess set having plural first recesses 112-1 containing first recess filler. First recesses 112-1 have first recess walls 111-1 in direct contact with inter-recess volume element 118 including inter-recess filler. First recesses 112-1 extend to proximal patterned encapsulant surface 113 at first recess openings 119-1 (see FIG. 4). In this embodiment, there are no second recesses 112-2.

A second embodiment of the light emitting device of the present invention is the same as the first embodiment, except that proximal patterned encapsulant region 117 contains a first recess set having a single first recess 112-1 having a single first recess opening 119-1. Typically, first recess opening 119-1 is coincident with all, or substantially all of proximal patterned encapsulant surface 113. That is, a single first recess 112-1 forms a continuous layer in contact with luminous surface 114, and is patterned due to variations in first recess depth 129-1. Those volume elements of proximal patterned encapsulant region 117 that are not first recess 112-1 are inter-recess volume element 110.

In a third embodiment of the light emitting device of the present invention, the proximal patterned encapsulant region 117 includes both a first recess set including at least one first recess 112-1 and a second recess set including at least one second recess 112-2.

The proximal patterned encapsulant region 117 of the present invention has at least one recess set and, if there is only one recess set, will also have an "inter-recess volume element set" which includes one or more inter-recess volume elements 118. When proximal patterned encapsulant region 117 contains more than one recess set, an inter-recess volume element set may or may not be present, depending on whether the distal surface of proximal patterned encapsulant region 117 is flat or patterned. If that distal surface is flat, there will be no inter-recess volume element set. If that distal surface is patterned, there will be an inter recess volume element set. In the case in which the encapsulant material is completely removed after formation of one or more recess sets, any inter recess volume will be occupied by air (or other environmental gas).

In a first embodiment of the method of making the light emitting device of the present invention, encapsulant block 120 is imprinted using patterned mold 122. A surface of encapsulant block 120 may be imprinted without an intervening layer being present on its surface (see FIGS. 6a-6d), or that surface may first be coated with a first recess filler layer 125. FIGS. 7a-7c represent this embodiment in which first recess filler layer 125 has been applied to encapsulant block 120 before imprinting (FIGS. 7b-7c) the coated face of block 120. FIGS. 7b-7d represent a case in which mold patterned surface 123 impinges first recess filler 125 sufficiently to form a relief pattern in encapsulant block 120 as well as in first recess filler layer 125. In such case, it may desirable to: remove all of first recess filler surface excess 126 by, for example, planarization to form plural first recesses 112-1 (see FIG. 7e); partially remove first recess filler surface excess 126; or remove none of surface excess 126 (see FIG. 7d). The indentations in the surface of the first recess filler layer, formed directly on first recess filler layer 125 by mold patterned surface 123, are second recesses 112-2. Alternatively, mold patterned surface 123 may impinge first recess filler layer 125 to form a relief pattern in first recess layer 125 without deforming the surface of encapsulant block 120. In absence of first recess filler layer 125, mold surface 123 imprints encapsulant block 120 directly, forming a relief pattern at that encapsulant block 120 surface (FIGS. 6a-6d). The indentations in that surface, formed directly on encapsulant block 120 by mold patterned surface 123, are first recesses 112-1. In these variants of this embodiment, a relief pattern having indentations is formed on the surface of the layer in direct contact with mold patterned surface 123. These indentations are first recesses 112-1 or second recesses 112-2, which are typically filled initially with air or other gas as, respectively, first recess filler or second recess filler. Alternatively, a non-gaseous first recess filler or second recess filler may be provided to flow into, respectively, first recess 112-1 or second recess 112-2 as mold patterned surface 123 is disengaged.

In a second embodiment of the method of making the light emitting device of the present invention, first recess filler layer 125 is applied to encapsulant block 120 and a second recess layer is applied to filler layer 125. A mold patterned surface 123 may be contacted with a surface of encapsulant block 120 before application of first recess filler layer 125. A mold patterned surface 123 may be contacted with any or all of encapsulant block, first recess filler layer 125 and second recess filler layer or layers. Further, the same patterned surface 123 may be used to imprint each contacted surface, or different patterned surfaces 123 may be used for imprinting different surfaces.

One skilled in the art will know that, when it is desired to form first recesses 112-1 and second recesses 112-2 in proximal patterned encapsulant region 117 by one or more imprinting steps, it is advantageous to provide positional indexing at one or more positions on light emitting device 100 during assembly, at one or more positions on the assembly stage upon which the device is held during assembly, or at positions on both device and assembly stage. In this way, alignment of patterns is achieved.

Further, the same surface (of the encapsulant block, or of a recess filler layer) may be imprinted by more than one mold patterned surface 123. For example, the surface of a first recess filler layer may be imprinted by one mold patterned surface 123 to form a pattern of second recesses 112-2, followed by filling of those second recesses with a second recess filler, removal of excess second recess filler, and curing, if necessary, of the second recess filler. Subsequent patterning of the first recess filler layer with another mold patterned surface 123 forms a another pattern of second recesses 112-2, followed by filling of those second recesses 112-2 with a second recess filler, removal of excess second recess filler, and curing, if necessary, of that second recess filler.

When a mold is used to imprint proximal patterned encapsulant region 117 with pattern, it will be recognized that, if a material is to be imprinted, the temperature at which the patterning will be carried out will typically be at or above the glass transition temperature (Tg) of the polymeric material. Typically, the polymeric material, the mold, or both will be maintained at that temperature until the desired pattern has been formed, and then the polymeric material, the mold, or both will be cooled to a temperature below the glass transition temperature of the polymeric material before withdrawing the mold. Further, the polymeric material and the material from which the mold is fabrication should be selected such that the mold material can release the polymeric material as it is being withdrawn.

When a pattern is formed in a curable filler, and the curing process requires UV light, the mold will typically be made of a material that is transparent to the wavelengths of UV light ultilized in the curing step. Once a pattern is formed in the curable filler, the UV light is applied through the mold to cure it. Alternatively, if the side opposite the mold is transparent to UV light, that UV light may be applied from the side opposite the mold and the mold need not be transparent to UV light.

In another embodiment of the present invention, the mold is fabricated from a high refractive index chip such as GaN, ZnS, $TiO_2$, or SiC using, for example, laser ablation. The mold is applied to form a pattern, but is not removed. Instead the mold itself becomes a recess set having a single recess filled with the mold material (e.g., GaN, ZnS, $TiO_2$ or SiC). The exterior surface of the imbedded mold may be flat, or may be patterned either before or after it is imbedded. Optical adhesive is then applied to the exterior surface of the mold material as a recess filler layer of thickness typically no more than 10 nm which either remains as a single continuous recess or as plural recesses having recess openings 119. The free standing encapsulant sheet is then bonded to a luminous stack surface 117 such that optical adhesive contacts that luminous stack surface 117.

In yet another embodiment, the proximal patterned stack surface is formed using a luminous stack surface as a substrate. Recess filler layers are built upon that surface to form a proximal patterned encapsulant region 117.

When an encapsulant layer is formed as a free standing light extraction encapsulant sheet suitable for subsequent application to a luminous stack surface, that layer has a patterned encapsulant region that will be referred to herein as a proximal patterned encapsulant region even in its free standing form. The term proximal is used because it is understood that the proximal patterned encapsulant region of the free standing sheet will be disposed upon a luminous stack surface when the sheet is attached to a multi-layer stack. A free standing "light extraction encapsulant sheet" becomes an encapsulant layer 109 having a proximal patterned encapsulant region 117 and, optionally, an unpatterned encapsulant region 110, once the sheet is attached to a luminous stack surface 114.

"Laser ablation" is a process by which material is removed by an intense laser beam. Holes can be made in polymer films by this technique. Laser ablation is further an alternative technique to the use of a mold for forming patterns.

When patterns are created using a patterned mold 122, that mold may have any configuration and be fabricated from any material known in the art. For example, the mold may be in the form of a flat plate, a single roller, or multiple rollers such as are common in calendaring operations. The mold may be configured for heating, for cooling, or both during the stamping operation. If first recess filler, second recess filler, or both are to be cured during the imprinting process, the mold will typically be manufactured from a material that is transparent to the wavelengths of light (e.g., ultraviolet) used to irradiate the material being cured.

Some embodiments of the invention will now be described in detail in the following Examples. Chemicals used in the Examples are listed in Table A.

Measurement of indentation depth. A profileometer Dektak-30 (Veeco, Woodbury, N.Y.) is used to measure the depth of indentations made in surfaces during preparation of patterned surfaces.

TABLE A

Abbreviations and descriptors

| Abbreviation or other descriptor | Name and description |
| --- | --- |
| GaN LED | Gallium nitride based light emitting chip XB900 (Cree; Durham, NC) |
| ITO | Indium tin oxide, used in ITO conducting coating |
| PET coated with ITO | Polyethylene terephthalate (PET) film coated with ITO (CPFilms; Matinsville, VA) |
| ITO/glass | Glass coated with ITO (Applied Films Corp.) |
| Si detector | Silicon detector (Thorlabs, Newton NJ) |
| Power meter | Thorlabs (Newton, NJ) |
| Copper coated Si wafer | Silicon wafer coated with copper metal (Silicon Valley Microelectronics) |
| Power source | Laser diode controller (LDC 500, Thorlabs, Newton NJ) |
| Surface profileometer | Measurement of indentation depth by Dektak-30 (Veeko, Woodbury, NY) |
| Spin coater | P6700 (Speciality Coating Systems, Indianapolis) |
| PET | Polyethylene terephthalate |
| RI | Refractive index of film measured with a Metricon (Pennington , NJ) |
| Optical adhesive | Optically transparent adhesive curable by heat or light. Optical adhesives can be obtained from Norland (Cranbury, NJ), Nye Optical (MA) , Dymax (MA) |
| LEF | Light Extraction Film - a polymer film with variable optical dielectric constant across it. It can either be applied as a free standing film to GaN wafer, or it can be fabricated layer by layer on a GaN wafer |

Note that the example devices indicated by device numbers (which may include letters) in the experimental section are not to be confused with the figure numbers in the drawings.

Comparative Example A

Multi-layer stack having luminous layer in contact with an unpatterned proximal encapsulant surface. A silicon wafer coated with copper (Cu) metal (Silicon Valley Microelectronics) acted as bottom electrode. An LED chip XB900 (Cree) was placed on the wafer. A drop of silicone fluid (Aldrich) was applied on top of the LED to help index match and minimize reflections at the GaN-ITO/glass interface. An ITO coated glass (Applied Films) was placed on top of the LED chip. The ITO glass had a surface roughness of 1-2 nm as measured with profilemeter(Dektac −30, Veeco). Electrodes were attached to both the Cu wafer and the ITO glass. The electrodes were supplied with current, measured in milliamps (mA), from laser Diode power source (LDC 500, Thorlabs). A silicon detector (Thorlabs) was placed on top of the LED chip location and attached to a volt meter which measured in volts. The current supplied was varied from 10 mA to 80 mA and the blue (460 nm) light from the LED was measured with the silicon detector and voltmeter The slope of the output voltage divided by the drive current was 0.019 V/mA.

Example 1

Encapsulation of a multi-layer stack having luminous stack surface in optical proximity to a proximal patterned encapsulant region. An LED was prepared by the method of Comparative Example A, except that, instead of an ITO glass, a PET film coated with ITO (CP Films) was placed on top of the LED chip. The PET/ITO film had a surface roughness of 17 nm, as measured with a profileometer (Dektak 30). A drop of silicone fluid (refractive index=1.47, Aldrich) was applied on top of the LED to help refractive index match and minimize reflections at the GaN-ITO/PET interface. The electrodes were applied to the Cu coated wafer and the PET/ITO film and current was passed through the LED chip. The output light was measured with silicon detector and power meter. The observed output of voltage from the silicone detector divided by the drive current of the LED was 0.04 V/mA. After adjusting for difference the difference in light transmission between the glass/ITO and the PET/ITO, the light output of the device of Example 1 was greater than that of the device of Comparative Example A by a factor of 1.4 (i.e., a 40% higher light output).

| Current supplied to LED, mA | Silicon detector output , V for Glass/ITO | Silicon detector output, V PET/ITO |
| --- | --- | --- |
| 10 | 0.169 | 0.3 |
| 20 | 0.375 | 0.609 |
| 30 | 0.564 | 0.948 |
| 40 | 0.765 | 1.27 |
| 50 | 0.94 | 1.58 |
| 60 | 1.174 | 1.91 |

Example 2

A GaN LED wafer (Cree) is spin coated, using a P6700 spin coater, to a thickness of 100 nm with ZIRKON™ low refractive index material (Rohm and Haas), having n=1.38. The coating is soft baked at 90° C. for 1 minute, and imprinted using a patterned mold having a periodic pattern of square pyramids having a maximum distance between protrusion tip and valley of 100 nm. The base of each square pyramid is 200 nm on a side. The length period in the two directions parallel to the orthogonal edges of each pyramid base is 250 nm. The ZIRKON™ low refractive index material layer is then cured (B-staged) at 250° C. for 2.0 hours in a nitrogen atmosphere, and the final imprinted coating thickness should be 80 nm. The refractive index, n, of the B-staged coating should be 1.1. A high refractive index poly(phenyl methyl siloxane) (n=1.54) is spin coated onto the surface of the patterned B staged coating to a thickness of 100 nm. The poly(phenyl methyl siloxane) is then cured by heating initially at 100° C. and gradually increasing the curing temperature to 130° C. during 3.0 hours. Holes are made in the film by laser ablation using an excimer laser (Oxford Lasers). The holes correspond to locations of electrical bond pads. The wafers are diced into 1×1 mm pieces using a wafer dicer (Kulicke and Soffa model 984). Gold wire bonds are attached to the GaN with a wire bonder (Kulicke and Soffa, model 1488). Electrical power is supplied to the LED chip. The light output should be 20 lumens/watt, as observed using a photometer system (model 2000, Ocean Optics).

Comparative Example B

A light emitting device was made using the method of Example 2, except that the encapsulant is applied directly to the top of the LED, without application of an intervening layer of B-staged ZIRCON™ low refractive index material. The encapsulant is a crosslinked phenyl methyl siloxane copolymer (n=1.54). The LED chip has wires attached to it as in example 2 and electrical power is supplied to the LED chip. The output power observed should be 10 lumens/watt.

Example 3

A GaN wafer (see Example 2) is coated with ZIRCON™ low refractive index material and the coating is B staged and imprinted as in Example 2. A transparent layer of silver is deposited on the imprinted film such that the thickness of the silver layer is 50 nm. The silver metal is deposited by sputtering (Denton Vacuum). The silver coated imprinted film is then coated with poly(phenyl methyl siloxane) and cured as in Example 2, and the light emitting device is finished and tested as in Example 2. The light emitting device having a transparent layer of silver is example device 3a. Devices 3b, 3c, and 3d are prepared by identical procedures, except that the transparent conducting layer is, respectively, gold, aluminum, or indium tin oxide (ITO). The observed light output for: device 3a should be 25 lumens/watt; device 3b should be 25 lumens/watt; device 3c should be 25 lumens/watt; and device 3d should be 25 lumens/watt.

Comparative Example C

A light emitting device is made using the method of Example 3, except that the encapsulant is applied directly to the top of the LED, without application of an intervening layer of B-staged ZIRCON™ low refractive index material. The encapsulant is a crosslinked phenyl methyl siloxane copolymer (n=1.54). The LED chip has wires attached to it as in Example 2, and electrical power is supplied to the LED chip. The output power observed should be 10 lumens/watt.

Example 4

A GaN LED wafer (Cree) is spin coated to a thickness of 100 nm with poly(phenyl methyl siloxane) having crosslinkable groups (Rohm and Haas, n=1.54). The coating is then imprinted using a patterned nickel mold having a pattern of square pyramids having a maximum distance between protrusion tip and valley of 100 nm and a length period of 250 nm, and heat cured at 130° C. Then the mold is removed. ZIRCON™ low refractive index material is coated onto the patterned surface of the cured poly(phenyl methyl siloxane) to a thickness of 100 nm as described in Example 2. The ZIRCON™ low refractive index film is then soft baked at 0° C. for 1 minute and B staged at 250° C. for 2.0 hours so that it's final thickness is 80 nm and n=1.1. Holes are made in the film by laser ablation, using an excimer laser (Oxford Laser). The wafers are diced as in Example 2 above. Gold wire bonds are attached to the GaN layer as in Example 2 above. Electrical power is supplied to the LED chip as in Example 2 above. The light output observed should be 20 lumens/watt.

Comparative Example D

A light emitting device is made using the method of Example 4, except that the poly(phenyl methyl siloxane) is applied directly to the top of the LED, without application of an intervening layer of B-staged ZIRCON™ low refractive index material. The encapsulant is a crosslinked poly(phenyl methyl siloxane) (n=1.58). The LED chip has wires attached to it as in Example 2 and electrical power is supplied to the LED chip. The output power observed should be 10 lumens/watt.

Example 5

A GaN wafer (see Example 4) is first coated with phenyl siloxane copolymer (n=1.58), and imprinted as in Example 4. A transparent layer of silver metal is deposited on the surface of the cured phenyl siloxane copolymer to a thickness of the silver layer is 30 nm. ZIRCON™ low refractive index material {Rohm and Haas, n=1.38) is then coated onto the patterned surface of the phenyl siloxane copolymer coating. The ZIRCON™ low refractive index layer is then B staged to give a B staged coating which should have a thickness of 80 nm and n=1.1. The light emitting device is finished and tested as in Example 4. The light emitting device having a transparent layer of silver is device 5a. Devices 5b, 5c, and 5d are prepared by identical procedures, except that the transparent metal layer is, respectively, gold, aluminum, or indium tin oxide. The observed light output for: device 5a should be 25 lumens/watt; device 5b should be 25 lumens/watt; device 5c should be 25 lumens/watt; and device 5d should be 25 lumens/watt.

Example 6

A GaN wafer is coated with a conducting layer of silver with a thickness of 10 nm. The silver layer is then patterned using an interference lithographic tool. The period of the pattern is 250 nm and the line width is 100 nm. A coating of poly(phenyl methyl siloxane) (n=1.54) having a thickness of 100 nm is then applied to the patterned surface. The poly (phenyl methyl siloxane) layer is then nanoimprinted as in Example 4, ensuring that the mold is registered (by alignment with positional indices) relative to the periodic pattern in the silver metal. The polymer is cured at an initial temperature of 100° C., gradually increasing the temperature to 130° C. during 3.0 hours. The mold is then removed. ZIRCON™ low refractive index material {Rohm and Haas, n=1.38) is cured to give a cured B-staged coating which should have a thickness of 80 nm and n=1.1. The light emitting device is finished and tested as in Example 4. The light emitting device having a transparent layer of silver is device 6a. Devices 6b, 6c, and 6d are prepared by identical procedures, except that the transparent metal layer is, respectively, gold, aluminum, or indium tin oxide. The observed light output for: device 6a should be 25 lumens/watt; device 6b should be 25 lumens/watt; device 6c should be 25 lumens/watt; and device 6d should be 25 lumens/watt.

Example 7

Preparation of a free standing light extraction sheet. A transparent high temperature polyimide film (Sixeff, Hoechst), having width, length, and thickness, respectively, of 10 cm, 10 cm, and 50 microns, is spin coated with phenyl methyl siloxane copolymer (n=1.58) to a coating thickness of 100 nm, as measured by Dektak-30. The film is imprinted using a patterned nickel mold having a pattern consisting of square pyramids having a maximum distance between protrusion tip and valley of 100 nm and a length period of 250 nm. The base of the pyramids is 100 nm. The periodicity is same in both x and y directions in the plane. The coating is cured at an initial temperature of 100° C., gradually increasing the temperature to 130° C. during 3.0 hours. The mold is then withdrawn. ZIRCON™ low refractive index material {Rohm and Haas, n=1.38) is spin coated to a thickness of 100 nm and dried at 100° C. The ZIRCON™ low refractive index layer is B staged according to the method of Example 4 to give a B staged coating having a thickness of 80 nm and n=1.1. Holes are made in the film by laser ablation so that the holes coincide with the location of electrical bond pads of the GaN wafer, as in Example 4. An optical adhesive with very low viscosity (Norland 74, 80 centipoise) is first spin coated onto the GaN wafer to a thickness of 5 nm. Then the light extraction film is attached to the wafer, making sure that there are no air gaps or bubbles. The optical adhesive is then cured by UV light, using a Spectronics Bench Mount (Norland, N.J.). The wafer is then diced with the LEF attached to it according to Example 2. Wire bonds are attached through holes in LEF to LED according to example 2. Electric current is passed through LED chip and light output measured. The light output should be 25 lumens/watt.

Example 8

Formation of a proximal patterned encapsulant region having a metal as a recess filler. A transparent high temperature polyimide film (Hitachi Chemical), having width, length, and thickness, respectively, of 10 cm, 10 cm, and 50 microns, is spin coated with phenyl methyl siloxane copolymer (n=1.54) to a coating thickness of 100 nm, as measured by Dektak-30. The film is imprinted using a patterned nickel mold having a pattern consisting of square pyramids having a maximum distance between protrusion tip and valley of 100 nm and a length period of 250 nm. The base of the pyramids is 100 nm. The pattern period is same in both x and y directions in the plane. After imprinting, the coating is cured at 130° C. and the mold withdrawn. A thin transparent metal film is sputtered onto the imprinted side of the film to a thickness of 50 nm. The metal is silver. ZIRCON™ low refractive index material {Rohm and Haas, n=1.38) is spin coated to a thickness of 100 nm and dried at 100° C. The ZIRCON™ low refractive index layer is B staged according to the method of Example 4 to give a B staged coating having a thickness of 80 nm and n=1.1. Holes are made in the film by laser ablation so that the holes coincide with the location of electrical bond pads of the GaN wafer, as in Example 4. An optical adhesive with very low viscosity (Norland 74, 80 centipoise) is first spin coated onto the GaN wafer to a thickness of 5 nm. The light extraction film (LEF) is then attached to the wafer, making sure that there are no air gaps or bubbles. The optical adhesive is then cured by UV light (Spectronics Bench Mount; Norland, N.J.). The wafer is then diced with the LEF attached to it according to Example 2. Wire bonds are attached through holes in LEF to LED according to example 2. Electric current is passed through LED chip and light output measured. The light emitting device having a transparent layer of silver is device $8a$. Devices $8b$, $8c$, and $8d$ are prepared by identical procedures, except that the transparent metal layer is, respectively, gold, aluminum, or indium tin oxide. The observed light output for: device $8a$ should be 25 lumens/watt; device $8b$ should be 25 lumens/watt; device $8c$ should be 25 lumens/watt; and device $8d$ should be 25 lumens/watt.

Example 9

A transparent high temperature polyimide film (Sixeff, Hoechst), having width, length, and thickness, respectively, of 10 cm, 10 cm, and 50 microns, is spin coated with is spin coated with ZIRCON™ low refractive index material (Rohm and Haas, n=1.38) to a thickness of 100 nm and soft baked at 100° C. The film is imprinted using a patterned nickel mold having a pattern consisting of square pyramids having a maximum distance between protrusion tip and valley of 100 nm and a length period of 250 nm. The base of the pyramids is 100 nm. The pattern period is same in both x and y directions in the plane. After nanoimprinting, the ZIRCON™ low refractive index layer is cured (B-staged) at 250° C. for 2.0 hours in a nitrogen atmosphere. The resultant nanoimprinted coating thickness should be 80 nm. A high refractive index poly (phenyl methyl siloxane (n=1.54) is spin coated onto the surface of the patterned B staged coating to a thickness of 100 nm, as measured by Dektak-30). The poly(phenyl methyl siloxane) is then cured by heating at an initial temperature of 100° C. for 3.0 hours. Holes are made in the film by laser ablation using an excimer laser (Oxford Laser). The holes correspond to locations of electrical bond pads. The films (LEFs) are attached with a very thin layer of UV curable adhesive, as in example 8 above, ensuring that there are no voids or bubbles. The wafers are diced into 1×1 mm pieces, using a wafer dicer using a wafer dicer (Kulicke and Soffa model 984). Gold wire bonds are attached to the GaN with a wire bonder (Kulicke and Soffa, model 1488). Electrical power is supplied to the LED chip. The light output observed should be 25 lumens/watt.

Example 10

A transparent high temperature polyimide film (Sixeff, Hoechst), having width, length, and thickness, respectively, of 10 cm, 10 cm, and 50 microns, is spin coated with ZIRCON™ low refractive index material (Rohm and Haas, n=1.38) to a thickness of 100 nm and soft baked at 100° C. The film is nanoimprinted using a patterned nickel mold having a pattern consisting of square pyramids having a maximum distance between protrusion tip and valley of 100 nm and a length period of 250 nm. The base of the pyramids is 100 nm. The pattern period is same in both x and y directions in the plane. After imprinting, the material is B staged at 250° C. for 2.0 hours in nitrogen atmosphere to give a layer having n=1.1, and a coating thickness of 80 nm. A thin transparent metal film is sputtered onto the imprinted side of the film to a thickness of 80 nm. The metal is silver. A high refractive index poly (phenyl methyl siloxane; n=1.54) is spin coated onto the surface of the patterned B staged coating to a thickness of 100 nm, as measured by Dektak-30. The poly(phenyl methyl siloxane) is then cured by heating initially at 100° C., gradually increasing the temperature to 130° C. during 3.0 hours. Holes are made in the film by laser ablation using an excimer laser (Oxford Laser). The holes correspond to locations of electrical bond pads. The films are attached with very thin layer of UV curable optical adhesive, as in Example 8, ensuring that there are no voids or bubbles. The wafers are diced into 1×1 mm pieces, using a wafer dicer (Kulicke and Soffa model 984). Gold wire bonds are attached to the GaN with a wire bonder (Kulicke and Soffa, model 1488). Electrical power is supplied to the LED chip. The light emitting device having a transparent layer of silver is device 10a. Devices 10b, 10c, and 10d are prepared by identical procedures, except that the transparent metal layer is, respectively, gold, aluminum, or indium tin oxide. The observed light output for: device 10a should be 25 lumens/watt; device 10b should be 25 lumens/watt; device 10c should be 25 lumens/watt; and device 10d should be 25 lumens/watt.

Example 11

A transparent high temperature polyimide film (Sixeff, Hoechst), having width, length, and thickness, respectively, of 10 cm, 10 cm, and 50 microns, is spin coated with ZIRCON™ low refractive index material (Rohm and Haas, n=1.54) to a thickness of 100 nm as measured by Dektak-30. The film is nanoimprinted using a patterned nickel mold having a pattern consisting of square pyramids having a maximum distance between protrusion tip and valley of 100 nm and a length period of 250 nm. The base of the pyramids is 100 nm. The pattern period is same in both x and y directions in the plane. The coating is cured initially at 100° C., gradually increasing the temperature to 130° C. during 3.0 hours. The mold is then withdrawn. ZIRCON™ low refractive index material (Rohm and Haas; n=1.38) is spin coated to a thickness of 100 nm and soft baked at 100° C. The ZIRCON™ low refractive index layer is then B staged according to the method of Example 4 to give a G staged coating having a thickness of 80 nm and n=1.1. A layer of silver is sputtered onto the XIRCON™ low refractive index layer to a thickness of 10 nm using a sputtering tool (Denton Vacuum). The silver film is then periocially imaged using an interference lithographic toll. The imaging process is registered to the periodic indentation underneath it in the poly(phenyl methyl siloxane) layer. The silver layer is then etched to make a periodic array of lines 100 nm wide with a pattern period of 250 nm. Holes are made in the film by laser ablation (Oxford Laser) so that the holes coincide with the location of electrical bond pads of the GaN wafer, as in Example 4. An optical adhesive with very low viscosity (Norland 74, 80 centipoise) is first spin coated onto the GaN wafer to a thickness of 5 nm. Next, the LEF film is attached to the wafer, making sure that there are no air gaps or bubbles. The optical adhesive is then cured using UV light (Spectronics Bench Mount; Norlan, N.J.). The wafer is diced into 1×1 mm pieces, using a wafer dicer (Kulicke and Soffa model 984). Gold wire bonds are attached to the GaN with a wire bonder (Kulicke and Soffa, model 1488). Electrical power is supplied to the LED chip. The light emitting device having a transparent layer of silver is device 11a. Devices 11b, 11c, and 11d are prepared by identical procedures, except that the transparent metal layer is, respectively, gold, aluminum, or indium tin oxide. The observed light output for: device 11a should be 25 lumens/watt; device 11b should be 25 lumens/watt; device 11c should be 25 lumens/watt; and device 11d should be 25 lumens/watt.

Example 12

A polyphenyl siloxane having crosslinkable groups with RI ~1.54 is mixed with nanophosphors CdSe whose dimensions are in the size range 1-10 nm. The nanophosphors are obtained from Evident Technology (Troy, N.Y.). The concentration of the nanophosphors is about 5% by weight in the phenyl siloxane polymer. A GaN LED wafer (Cree) is spin coated to a thickness of 100 nm. The coating is then imprinted using a patterned nickel mold having a pattern of square pyramids having a maximum distance between protrusion tips and valleys of 100 nm and a length period of 250 nm, and heat cured at 130° C. The mold is then removed. Zircon™ low refractive index material is coated onto patterned surface of the cured polyphenyl siloxane to a thickness of 100 nm as described in example 2. The Zircon low refractive index layer is soft baked at 100° C. for 1 minute and B staged at 250° C. for 2.0 hours so that it's final thickness is 80 nm and n=1.1. Holes are made by laser ablation using an Eximer laser (Oxford laser). The wafers are diced as in example 2 above. Gold wire bonds are attached to GaN layer. Electrical power is supplied to the LED chip as in example 2 above. White light in the wavelength range 465 nm-640 nm should be observed, and a light output of 20 lumens/watt should be observed.

Example 13

Inorganic lens array with polymer film. A hybrid film including a high refractive index inorganic material and a polymer is fabricated as follows. A quartz mold patterned with a circular lens array, wherein the lenses have a radius of curvature of 28.7 microns and a sag of 10 microns (where "sag" refers to the maximum height of the mold lens protrusions. A mold including a lens array pattern in quartz is obtained from MEMS Optical (Huntsville, Ala.). A polydimethyl siloxane (PDMS, Sylgard 184, Dow Corning) is poured over the lens array mold and then cured. The PDMS film is pealed away, leaving behind an imprint of the lens array. The film includes periodic hemispherical recesses 10 microns deep. The film is subsequently placed in an evaporation chamber (Evaporated Coating (Willow Grove, PS) and ZnS is deposited, using a PVD process with a Dynavac machine (Hingham, Mass.), such that the recesses are filled with ZnS. Finally, the excess ZnS is polished away from the film, leaving behind a smooth ZnS surface. The composite film formed has hemispherical ZnS lenses in a polymer matrix. The hybrid film is placed on a GaN LED device so that excellent optical contact is made between the ZnS and GaN surfaces. Current is supplied to the device and 20 Lumens/watt should be observed.

Comparative Example E

A PDMS film is applied directly to the GaN surface of an LED. Current is supplied, and the light output should be 10 lumens/watt.

I claim:
1. A method of preparing a light extraction encapsulant sheet, comprising the steps of:
    A) providing an encapsulant block comprising a polymeric encapsulant material; and
    B) forming a patterned encapsulant region having an exterior patterned encapsulant surface on a surface of said encapsulant block;
        wherein said step of forming said patterned encapsulant region comprises:
        a) forming a first recess set comprising at least one first recess;
        b) filling said first recess with a first recess filler;
        c) optionally, forming a second recess set comprising at least one second recess; and
            filling said second recess with a second recess filler;
        wherein at least one of said first recess set and said second recess set has a pattern wherein:
            said pattern is a periodic pattern,
            said pattern has a feature size, in at least one lateral dimension, of at least 5 nanometers and no more than 5,000 microns;

said periodic pattern has a period, in at least one lateral dimension, of at least 10 nanometers and no more than 5,000 microns;

said first recess has a maximum recess depth of at least 25 nanometers and no more than 10,000 microns;

said second recess has a maximum recess depth of at least 25 nanometers and no more than 10,000 microns;

at least one of said first recess and said second recess has a recess opening coincident with said exterior patterned encapsulant surface; and said first recess filler differs in refractive index from at least one of said second recess filler and said encapsulant material by at least 0.001 and no more than 3.0.

2. The method of claim 1, wherein:

said pattern has a feature size, in at least one lateral dimension, of at least 5 nanometers and no more than 2,000 nanometers; and said periodic pattern has a period, in at least one lateral dimension, of at least 10 nanometers and no more than 2,000 nanometers.

3. The method of claim 1, wherein at least one of said first recess filler and said second recess filler is selected from GaN, SiC, AlN, ZnS, $TiO_2$ ZnO, GaP, and high RI glass.

4. The method of claim 1, wherein at least one of said first recess filler and said second recess filler is a curable B-staged optical material comprising porogen particles having a mean particle size of at least 5 nm and no more than 50 nm, wherein said curable B-staged optical material is further subjected to the steps of:

curing said curable B-staged optical material; and removing said porogen particles to form a cured B-staged optical material comprising pores, wherein said pores have a mean pore size of at least 5 nm and no more than 50 nm; and wherein said cured B-staged optical material has a porosity of at least 0.1 volume percent and no more than 95 volume percent, based on the volume of said cured B-stage optical material.

5. The method of claim 1, wherein said encapsulant material is a cured B-staged optical material comprising pores, wherein said encapsulant material is formed by the further steps of:

providing a curable B-staged optical material comprising porogen particles having a mean particle size of at least 5 nm and no more than 50 nm;

forming said curable B-staged optical material into a shape desired for said encapsulant block;

curing said curable B-staged optical material to form a cured B-stage optical material; and removing said porogen particles to form said cured B-staged optical material comprising pores, wherein said pores have a mean pore size of at least 5 nm and no more than 50 nm; and wherein said cured B-staged optical material has a porosity of at least 0.1 volume percent and no more than 95 volume percent, based on the volume of said cured B-stage optical material.

6. The method of claim 1 further comprising the steps of:

C) affixing said light extraction encapsulant sheet to a multi-layer stack, wherein said multi-layer stack comprises:
an n-doped layer;
a light-generating layer; and
a p-doped layer,
wherein said multi-layer stack has a luminous stack surface; and wherein said exterior patterned encapsulant surface is disposed upon said luminous stack surface;

wherein said luminous stack surface has a topography selected from smooth surface and patterned multilevel surface; and wherein said patterned multilevel surface has a periodic pattern; and D) optionally removing all or a portion of said encapsulant material from contact with said any or said first recess set and said second recess set.

7. The method of claim 6, wherein said multi-layer stack further comprises high refractive index top layer disposed upon said luminous stack surface, wherein, after said affixing, said high refractive index top layer is an intervening high refractive index layer disposed between said exterior patterned encapsulant surface and said luminous stack.

8. The method of claim 6, further comprising the step of applying an optical adhesive to either or both of said exterior patterned encapsulant surface and said luminous stack surface before said step of affixing.

9. A light extraction encapsulant sheet suitable for encapsulating a light emitting device, formed by the method of claim 1, comprising:

a proximal patterned encapsulant region comprising a polymeric encapsulant material having a proximal patterned encapsulant surface, said region comprising:

a first recess set comprising at least one first recess comprising a first recess filler;

optionally, a second recess set comprising at least one second recess comprising a second recess filler; and a proximal patterned encapsulant surface exterior to said encapsulant sheet;

wherein at least one of said first recess set and said second recess set has a pattern wherein:

said pattern is a periodic pattern, said pattern has a feature size, in at least one lateral dimension, of at least 5 nanometers and no more than 5,000 microns;

said periodic pattern has a period, in at least one lateral dimension, of at least 10 nanometers and no more than 5,000 microns;

said first recess has a maximum recess depth of at least 25 nanometers and no more than 10,000 microns;

said second recess has a maximum recess depth of at least 25 nanometers and no more than 10,000 microns;

at least one of said first recess and said second recess has a recess opening coincident with said exterior patterned encapsulant surface; and said first recess filler differs in refractive index from at least one of second recess filler and said encapsulant material by at least 0.001 and no more than 3.0.

10. The light extraction encapsulant sheet of claim 9, wherein at least one of said first recess filler and said second recess filler is selected from GaN, SiC, AlN, ZnS, $TiO_2$ ZnO, GaP, and high RI glass; and wherein, optionally, at least one of said first recess filler and said second recess filler is a cured B-staged optical material comprising pores, wherein said pores have a mean pore size of at least 5 nm and no more than 50 nm; and wherein said cured B-staged optical material has a porosity of at least 0.1 volume percent and no more than 95 volume percent, based on the volume of said cured B-stage optical material.

* * * * *